US012659077B2

(12) United States Patent 　(10) Patent No.: US 12,659,077 B2
Sen et al. 　(45) Date of Patent: Jun. 16, 2026

(54) PROBABILISTIC SHAPING FOR RETRANSMISSIONS

(71) Applicant: QUALCOMM Incorporated, San Diego, CA (US)

(72) Inventors: Pinar Sen, San Diego, CA (US); Wei Yang, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 419 days.

(21) Appl. No.: 18/316,107

(22) Filed: May 11, 2023

(65) Prior Publication Data

US 2024/0380515 A1 　Nov. 14, 2024

(51) Int. Cl.
　*H04L 1/00* 　(2006.01)
　*H03M 13/15* 　(2006.01)
　(Continued)

(52) U.S. Cl.
　CPC ........ *H04L 1/0061* (2013.01); *H03M 13/155* (2013.01); *H04L 1/003* (2013.01);
　(Continued)

(58) Field of Classification Search
　CPC ..... H04L 1/0061; H04L 1/003; H04L 1/0057; H04L 1/1819; H04L 1/1893; H04L 1/0042; H03M 13/255; H03M 13/155
　See application file for complete search history.

(56) References Cited

U.S. PATENT DOCUMENTS

| | | | |
|---|---|---|---|
| 2021/0211229 A1* | 7/2021 | Doan et al. | ........... H04L 1/0057 |
| 2021/0359784 A1* | 11/2021 | Iscan et al. | ........... H04L 1/0005 |
| 2022/0352904 A1* | 11/2022 | Montorsi et al. | .... H03M 13/118 |

FOREIGN PATENT DOCUMENTS

| | | | | |
|---|---|---|---|---|
| WO | WO 2020/083492 A1 * | 4/2020 | ........... | H04L 1/0042 |
| WO | WO-2020208290 A1 * | 10/2020 | ........... | H04L 1/0042 |
| WO | 2022188015 | 9/2022 | | |

OTHER PUBLICATIONS

Symbol-wise Puncturing for HARQ Integration with Probabilistic Amplitude Shaping, Li Shen, Jul. 23, 2022 (Year: 2022).*

(Continued)

*Primary Examiner* — Rebecca E Song
*Assistant Examiner* — Gary A Miller
(74) *Attorney, Agent, or Firm* — Loza & Loza, LLP

(57) 　　ABSTRACT

An apparatus (e.g., a transmitter) may transmit a message and one or more retransmissions of the message in a wireless communication network. The message may include a codeword that includes information bits and error correction bits (e.g., parity bits). The one or more retransmissions may include error correction bits associated with the information bits. To improve the decoding performance at a receiver, the transmitter may apply probabilistic shaping to the one or more retransmissions. In some aspects, the apparatus transmits a first message including information bits and a first set of error correction bits associated with the information bits. The apparatus transmits at least a second message associated with the first message, wherein the second message includes a second set of error correction bits associated with the information bits and a set of probabilistic shaping bits for the second set of error correction bits.

21 Claims, 19 Drawing Sheets

1100

1102

> Transmit a message including information bits and a set of error correction bits associated with the information bits

1104

> Transmit one or more subsequent messages associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution

(51) Int. Cl.
  *H04L 1/1812*        (2023.01)
  *H04L 1/1867*        (2023.01)
  *H03M 13/25*        (2006.01)

(52) U.S. Cl.
  CPC .......... *H04L 1/0057* (2013.01); *H04L 1/1819*
      (2013.01); *H04L 1/1893* (2013.01); *H03M*
                                *13/255* (2013.01)

(56)                References Cited

OTHER PUBLICATIONS

International Search Report and Written Opinion—PCT/US2024/
024861—ISA/EPO—Jul. 9, 2024.
Shen L., et al., "Symbol-Wise Puncturing for HARQ Integration
With Probabilistic Amplitude Shaping", IEEE Wireless Communi-
cations Letters, IEEE, Piscataway, NJ, USA, vol. 11, No. 10, Jul. 26,
2022, pp. 2110-2114, XP011922255, Sections II, III.

* cited by examiner

Transmit a first message and at least a second message associated with the first message, the second message including error correction bits associated with information bits of the first message and including a set of probabilistic shaping bits for the error correction bits 704 Receiver 702 Transmitter 705 Configuration information 706 Message

708

710 First retransmission of message

NACK_1

712

714 Second retransmission of message

NACK_2

716

718 Nth retransmission of message

NACK_N

• • •

700

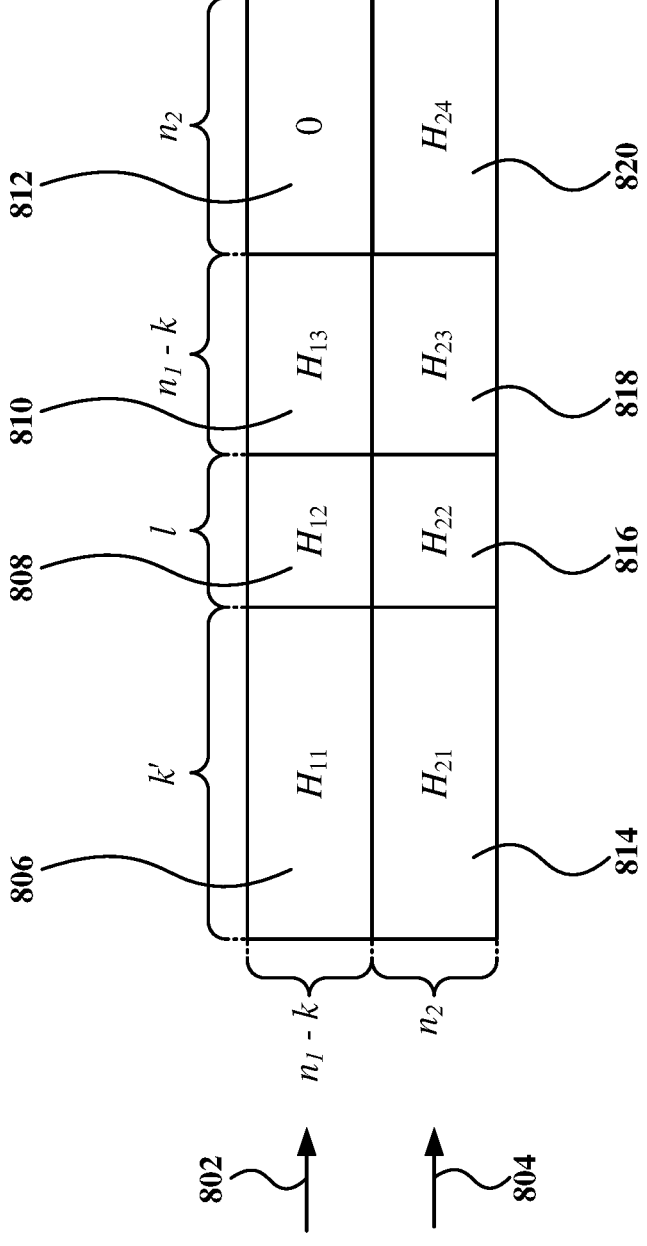
FIG. 8A

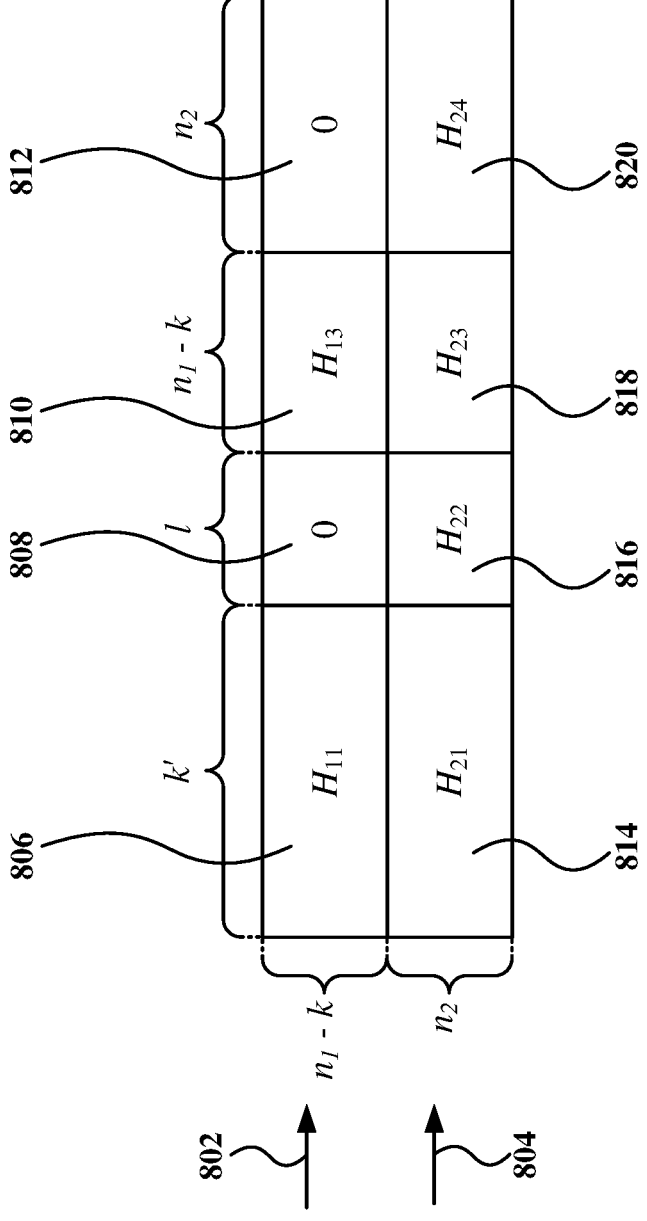
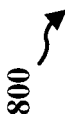
FIG. 8B

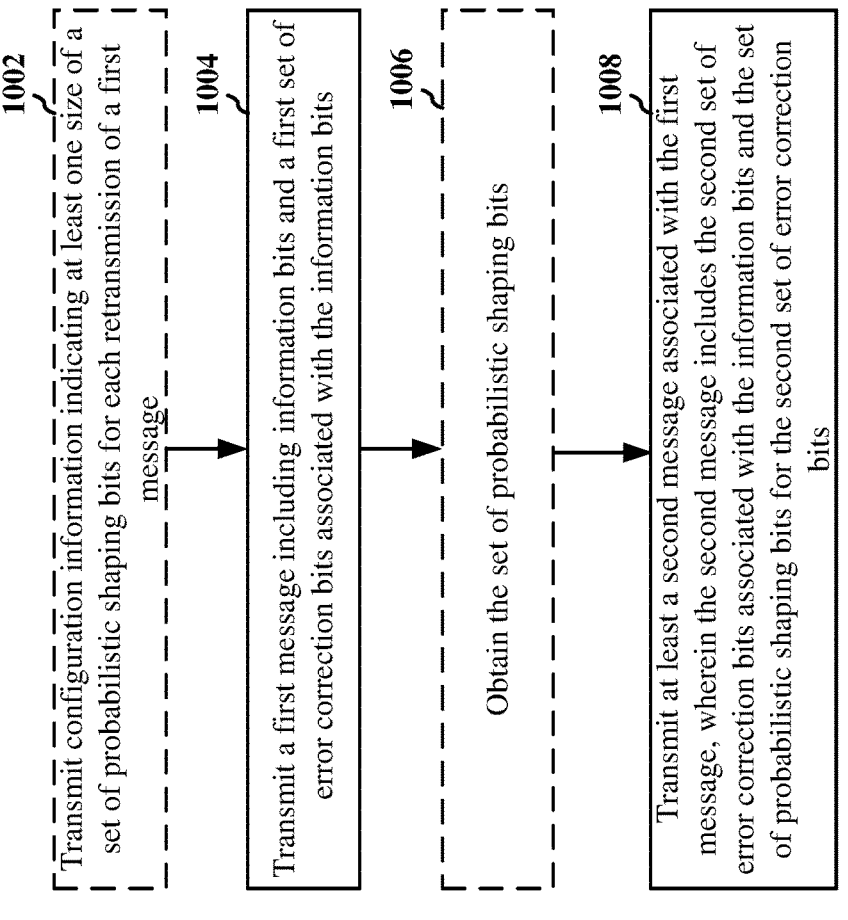

1002

Transmit configuration information indicating at least one size of a set of probabilistic shaping bits for each retransmission of a first message

1004

Transmit a first message including information bits and a first set of error correction bits associated with the information bits

1006

Obtain the set of probabilistic shaping bits

1008

Transmit at least a second message associated with the first message, wherein the second message includes the second set of error correction bits associated with the information bits and the set of probabilistic shaping bits for the second set of error correction bits

Transmit a message including information bits and a set of error correction bits associated with the information bits

1104

Transmit one or more subsequent messages associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution

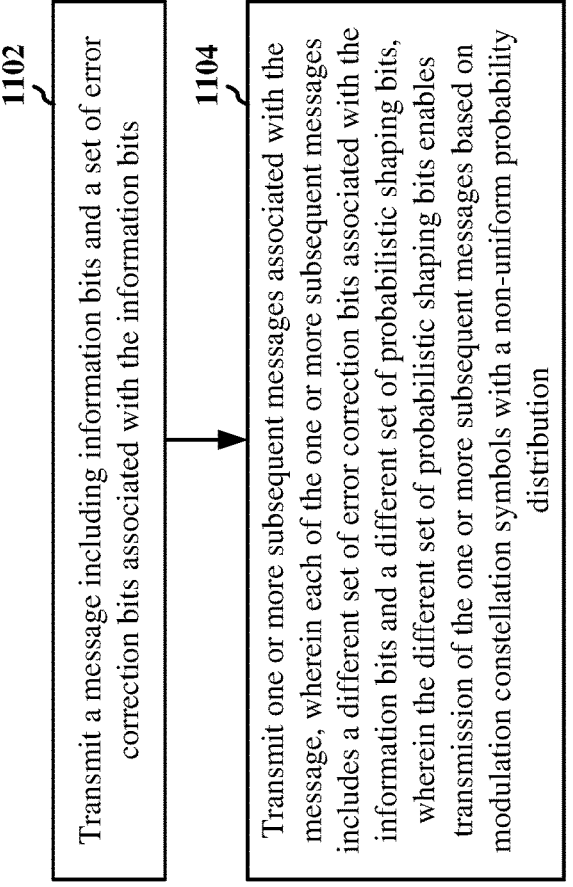

FIG. 11

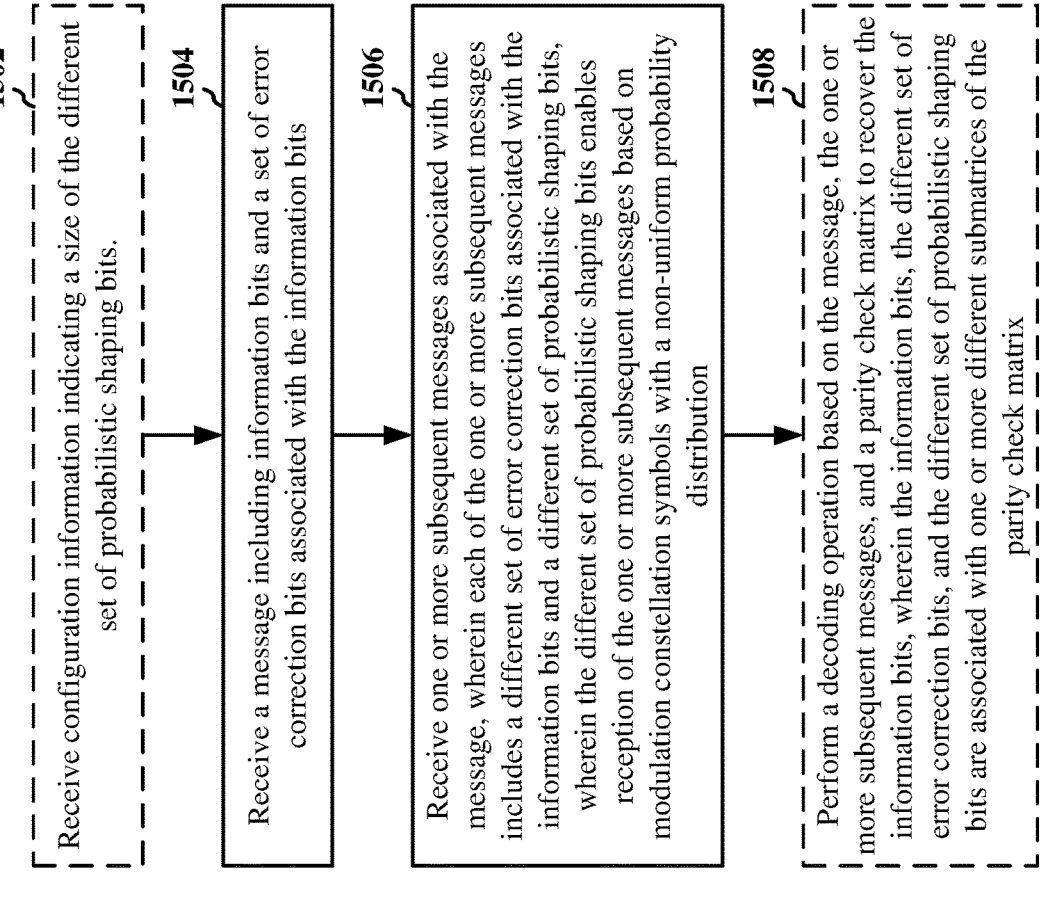

1502 — Receive configuration information indicating a size of the different set of probabilistic shaping bits.

1504 — Receive a message including information bits and a set of error correction bits associated with the information bits 1506 — Receive one or more subsequent messages associated with the message, wherein each of the one or more subsequent messages includes a different set of error correction bits associated with the information bits and a different set of probabilistic shaping bits, wherein the different set of probabilistic shaping bits enables reception of the one or more subsequent messages based on modulation constellation symbols with a non-uniform probability distribution 1508 — Perform a decoding operation based on the message, the one or more subsequent messages, and a parity check matrix to recover the information bits, wherein the information bits, the different set of error correction bits, and the different set of probabilistic shaping bits are associated with one or more different submatrices of the parity check matrix

PROBABILISTIC SHAPING FOR RETRANSMISSIONS

BACKGROUND

Technical Field

The present disclosure relates generally to communication systems, and more particularly, to probabilistic shaping for retransmissions.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An apparatus (e.g., a transmitter) may transmit a message and one or more retransmissions of the message in a wireless communication network. The message may include a codeword (e.g., a low density parity check (LDPC) codeword) that includes information bits and error correction bits (also referred to as parity bits). The one or more retransmissions may include error correction bits associated with the information bits and may not include the information bits. To improve the decoding performance at a receiver, the transmitter may apply probabilistic shaping to the one or more retransmissions.

In an aspect of the disclosure, a method, a computer-readable medium, and an apparatus are provided. The apparatus transmits a first message including information bits and a first set of error correction bits associated with the information bits. The apparatus transmits at least a second message associated with the first message, wherein the second message includes a second set of error correction bits associated with the information bits and a set of probabilistic shaping bits for the second set of error correction bits.

In an aspect of the disclosure, a method, a computer-readable medium, and an apparatus are provided. The apparatus receives a first message including information bits and a first set of error correction bits associated with the information bits. The apparatus receives at least a second message associated with the first message, wherein the second message includes a second set of error correction bits associated with the information bits and a set of probabilistic shaping bits for the second set of error correction bits.

In an aspect of the disclosure, a method, a computer-readable medium, and an apparatus are provided. The apparatus transmits a message including information bits and a set of error correction bits associated with the information bits. The apparatus transmits one or more subsequent messages associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution.

In an aspect of the disclosure, a method, a computer-readable medium, and an apparatus are provided. The apparatus receives a message including information bits and a set of error correction bits associated with the information bits. The apparatus receives one or more subsequent messages associated with the message, wherein each of the one or more subsequent messages includes a different set of error correction bits associated with the information bits and a different set of probabilistic shaping bits, wherein the different set of probabilistic shaping bits enables reception of the one or more subsequent messages based on modulation constellation symbols with a non-uniform probability distribution.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 8A and 8B are diagrams illustrating an example of a parity check matrix for a systematic low density parity check (LDPC) code in accordance with various aspects of the disclosure.

FIG. 10 is a flowchart of a method of wireless communication.

FIG. 11 is a flowchart of a method of wireless communication.

FIG. 15 is a flowchart of a method of wireless communication.

DETAILED DESCRIPTION

Figure 1:
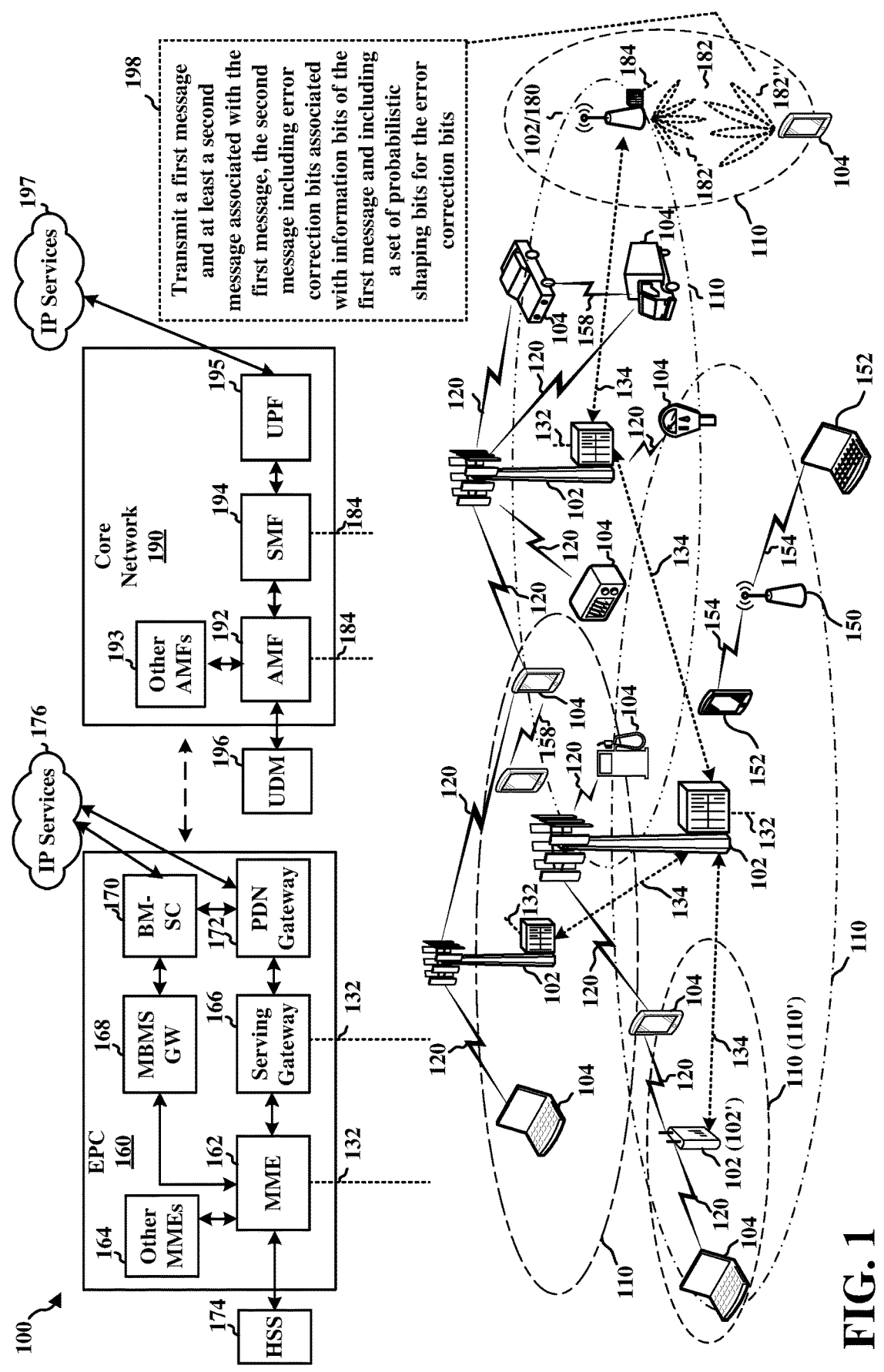
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FP-GAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EE-PROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through backhaul links 132 (e.g., S1 interface). The base stations 102 configured for 5G NR (collectively referred to as Next Generation RAN (NG-RAN)) may interface with core network 190 through backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

A base station 102, whether a small cell 102' or a large cell (e.g., macro base station), may include an eNB, gNodeB (gNB), or another type of base station. Some base stations, such as gNB 180 may operate in a traditional sub 6 GHz spectrum, in millimeter wave (mmW) frequencies, and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHZ with a wavelength of 100 millimeters. The super high frequency (SHF) band extends between 3 GHZ and 30 GHz, also referred to as centimeter wave. Communications using the mmW/near mmW radio frequency band (e.g., 3 GHZ-300 GHZ) has extremely high path loss and a short range. The mmW base station 180 may utilize beamforming 182 with the UE 104 to compensate for the extremely high path loss and short range.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

The base station may also be referred to as a gNB, Node B, evolved Node B (eNB), an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104 may be configured to transmit a first message and at least a second message associated with the first message, the second message including error correction bits (also referred to as parity bits) associated with information bits of the first message and including a set of probabilistic shaping bits for the error correction bits (198). Although the following description may be focused on 5G NR, the concepts described herein may be applicable to other similar areas, such as LTE, LTE-A, CDMA, GSM, and other wireless technologies.

Figures 2A, 2B, 2C, 2D:
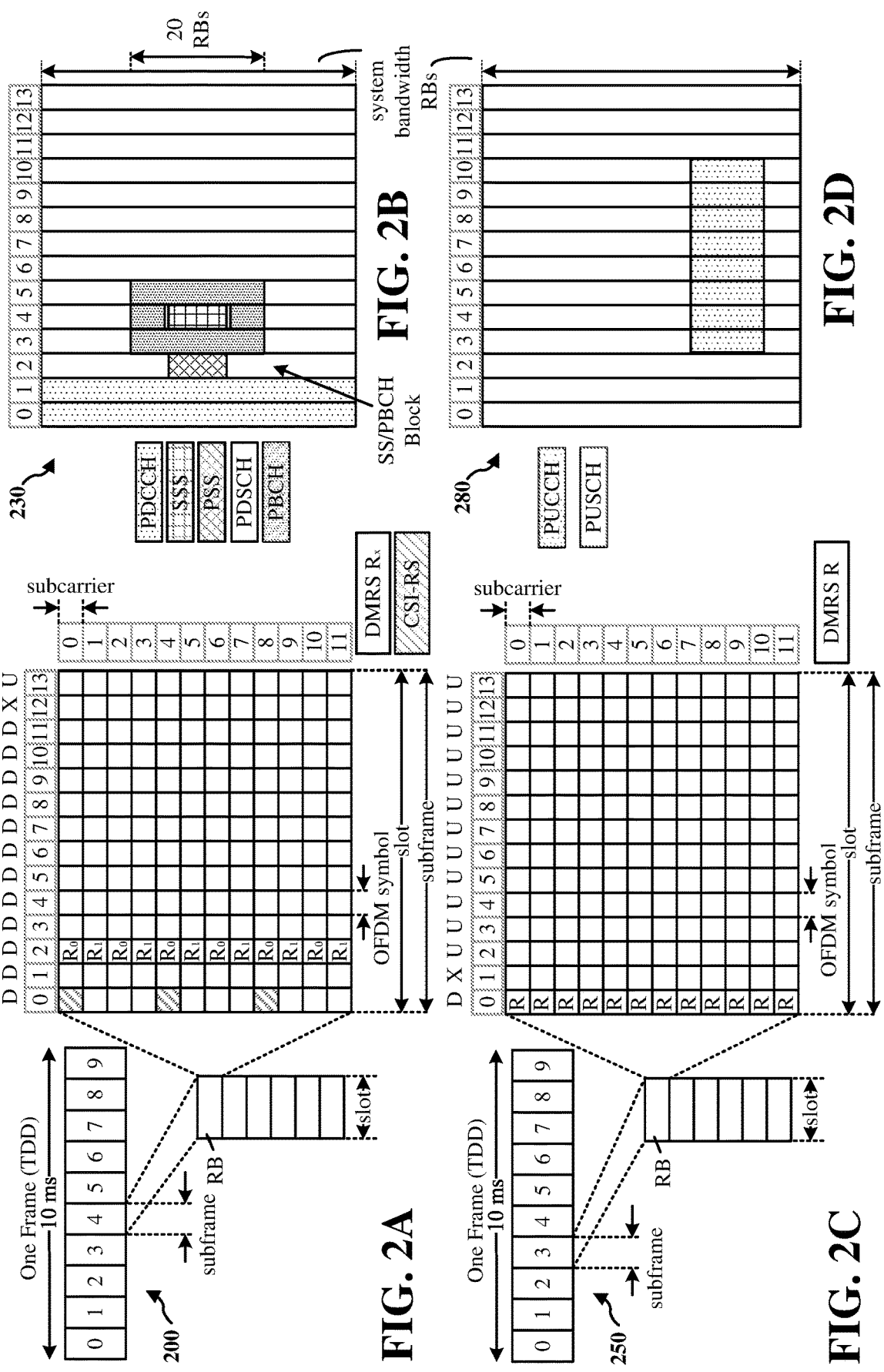
FIGS. 2A, 2B, 2C, and 2D are diagrams illustrating examples of a first 5G/NR frame, DL channels within a 5G/NR subframe, a second 5G/NR frame, and UL channels within a 5G/NR subframe, respectively.

FIG. 2A is a diagram 200 illustrating an example of a first subframe within a 5G/NR frame structure. FIG. 2B is a diagram 230 illustrating an example of DL channels within a 5G/NR subframe. FIG. 2C is a diagram 250 illustrating an example of a second subframe within a 5G/NR frame structure. FIG. 2D is a diagram 280 illustrating an example of UL channels within a 5G/NR subframe. The 5G/NR frame structure may be FDD in which for a particular set of subcarriers (carrier system bandwidth), subframes within the set of subcarriers are dedicated for either DL or UL, or may be TDD in which for a particular set of subcarriers (carrier system bandwidth), subframes within the set of subcarriers are dedicated for both DL and UL. In the examples provided by FIGS. 2A, 2C, the 5G/NR frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G/NR frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies $\mu$ 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology $\mu$, there are 14 symbols/slot and $2^\mu$ slots/subframe. The subcarrier spacing and symbol length/duration are a function of the numerology. The subcarrier spacing may be equal to $2^\mu*15$ kKz, where u is the numerology 0 to 5. As such, the numerology $\mu=0$ has a subcarrier spacing of 15 kHz and the numerology $\mu=5$ has a subcarrier spacing of 480 kHz. The symbol length/duration is inversely related to the subcarrier spacing. FIGS. 2A-2D provide an example of slot configuration 0 with 14 symbols per slot and numerology $\mu=0$ with 1 slot per subframe. The subcarrier spacing is 15 kHz and symbol duration is approximately 66.7 $\mu$s.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as Rx for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. Although not shown, the UE may transmit sounding reference signals (SRS). The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
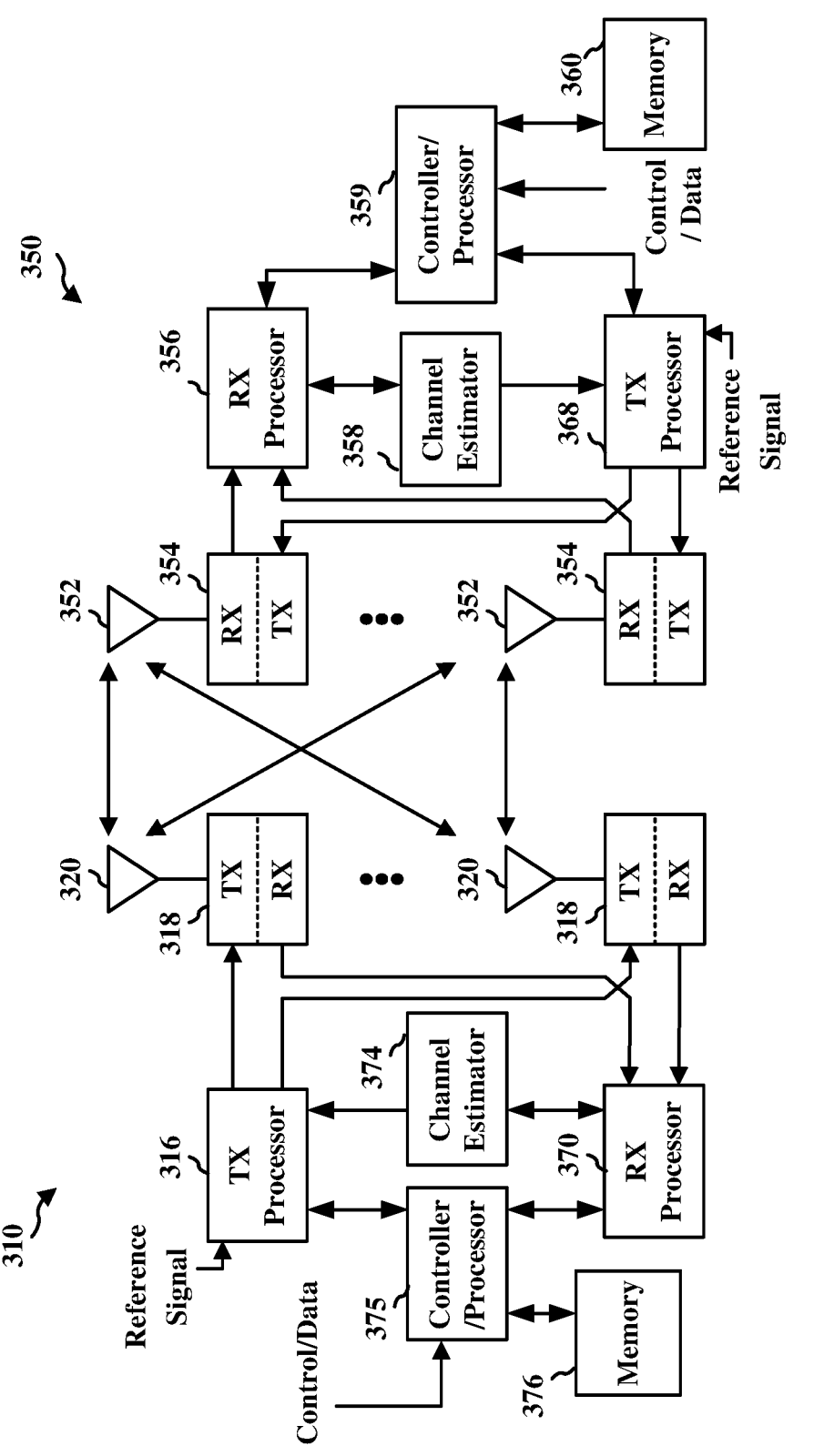
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with 198 of FIG. 1. At least one of the TX processor 316, the RX processor 370, and the controller/processor 375 may be configured to perform aspects in connection with 198 of FIG. 1.

Deployment of communication systems, such as 5G new radio (NR) systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmit receive point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUS)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU. DU and RU also can be implemented as virtual units, i.e., a virtual central unit (VCU), a virtual distributed unit (VDU), or a virtual radio unit (VRU).

Base station-type operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

Deployment of communication systems, such as 5G new radio (NR) systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB (gNB), access point (AP), a transmit receive point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUS)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU also can be implemented as virtual units, i.e., a virtual central unit (VCU), a virtual distributed unit (VDU), or a virtual radio unit (VRU).

Base station-type operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

Figure 4:
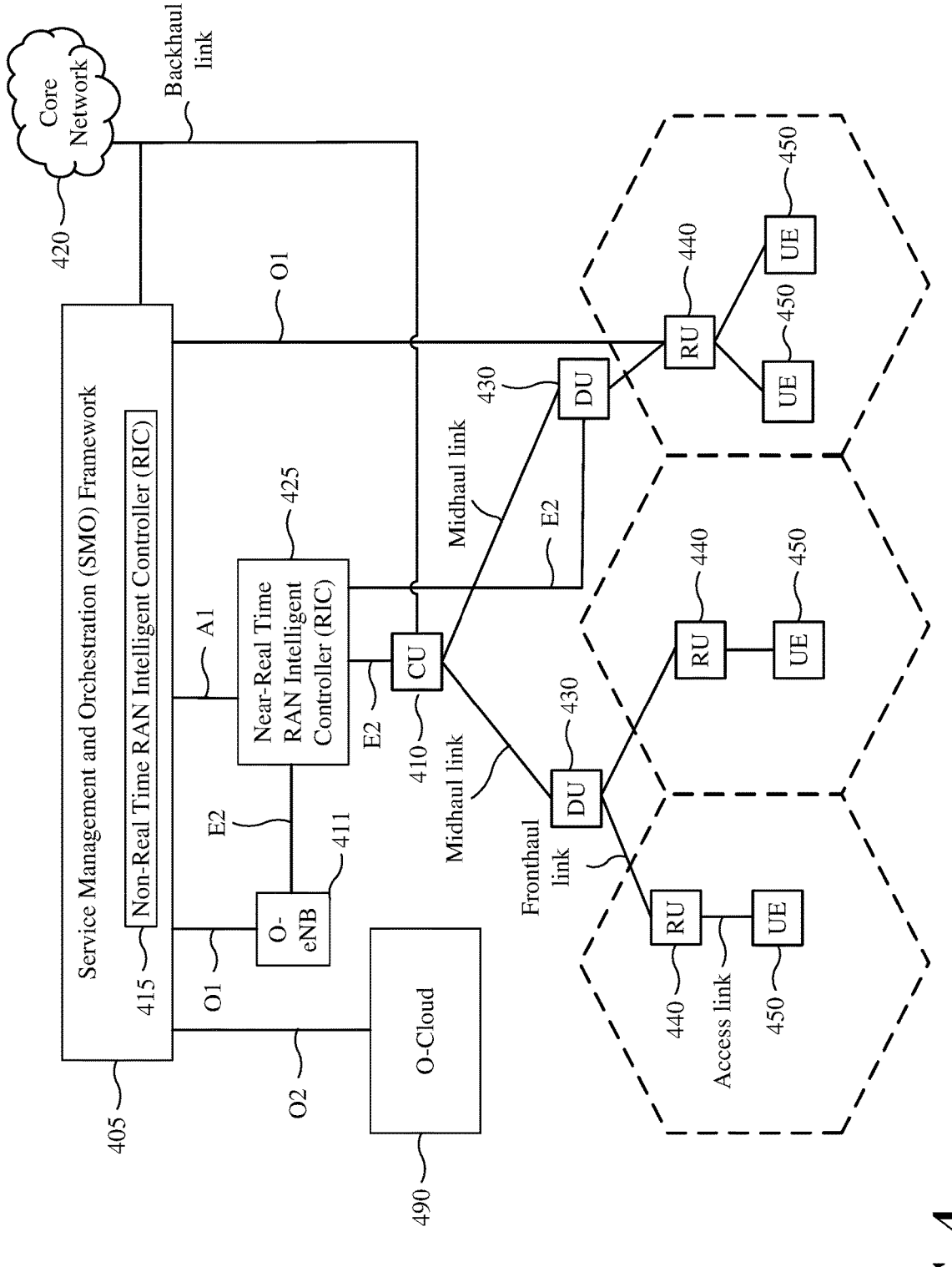
FIG. 4 shows a diagram illustrating an example disaggregated base station architecture according to some aspects of the present disclosure.

FIG. 4 shows a diagram illustrating an example disaggregated base station 400 architecture. The disaggregated base station 400 architecture may include one or more central units (CUs) 410 that can communicate directly with a core network 420 via a backhaul link, or indirectly with the core network 420 through one or more disaggregated base station units (such as a Near-Real Time (Near-RT) RAN Intelligent Controller (RIC) 425 via an E2 link, or a Non-Real Time (Non-RT) RIC 415 associated with a Service Management and Orchestration (SMO) Framework 405, or both). A CU 410 may communicate with one or more distributed units (DUs) 430 via respective midhaul links, such as an F1 interface. The DUs 430 may communicate with one or more radio units (RUS) 440 via respective fronthaul links. The RUs 440 may communicate with respective UEs 450 via one or more radio frequency (RF) access links. In some implementations, the UE 450 may be simultaneously served by multiple RUs 440.

Each of the units, i.e., the CUs 410, the DUs 430, the RUs 440, as well as the Near-RT RICs 425, the Non-RT RICs 415 and the SMO Framework 405, may include one or more interfaces or be coupled to one or more interfaces configured to receive or transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or transmit signals over a wired transmission medium to one or more of the other units. Additionally, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 410 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 410. The CU 410 may be configured to handle user plane functionality (i.e., Central Unit-User Plane (CU-UP)), control plane functionality (i.e., Central Unit-Control Plane (CU-CP)), or a combination thereof. In some implementations, the CU 410 can be logically split into one or more CU-UP units and one or more CU-CP units. The CU-UP unit can communicate bidirectionally with the CU-CP unit via an interface, such as the E1 interface when implemented in an O-RAN configuration. The CU 410 can be implemented to communicate with the DU 430, as necessary, for network control and signaling.

The DU 430 may correspond to a logical unit that includes one or more base station functions to control the operation of one or more RUs 440. In some aspects, the DU 430 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3rd Generation Partnership Project (3GPP). In some aspects, the DU 430 may further host one or more low PHY layers. Each layer (or module) can be implemented with an interface configured to communicate signals with other layers (and modules) hosted by the DU 430, or with the control functions hosted by the CU 410.

Lower-layer functionality can be implemented by one or more RUs 440. In some deployments, an RU 440, controlled by a DU 430, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 440 can be implemented to handle over the air (OTA) communication with one or more UEs 450. In some implementations, real-time and non-real-time aspects of control and user plane communication with the RU(s) 440 can be controlled by the corresponding DU 430. In some scenarios, this configuration can enable the DU(s) 430 and the CU 410 to be implemented in a cloud-based RAN architecture, such as a vRAN architecture.

The SMO Framework 405 may be configured to support RAN deployment and provisioning of non-virtualized and virtualized network elements. For non-virtualized network elements, the SMO Framework 405 may be configured to support the deployment of dedicated physical resources for RAN coverage requirements which may be managed via an operations and maintenance interface (such as an O1 interface). For virtualized network elements, the SMO Framework 405 may be configured to interact with a cloud computing platform (such as an open cloud (O-Cloud) 490) to perform network element life cycle management (such as to instantiate virtualized network elements) via a cloud computing platform interface (such as an O2 interface). Such virtualized network elements can include, but are not limited to, CUs 410, DUs 430, RUs 440 and Near-RT RICs 425. In some implementations, the SMO Framework 405 can communicate with a hardware aspect of a 4G RAN, such as an open eNB (O-eNB) 411, via an O1 interface. Additionally, in some implementations, the SMO Framework 405 can communicate directly with one or more RUs 440 via an O1 interface. The SMO Framework 405 also may include a Non-RT RIC 415 configured to support functionality of the SMO Framework 405.

The Non-RT RIC 415 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 425. The Non-RT RIC 415 may be coupled to or communicate with (such as via an A1 interface) the Near-RT RIC 425. The Near-RT RIC 425 may be configured to include a logical function that enables near-real-time control and optimization of RAN elements and resources via data collection and actions over an interface (such as via an E2 interface) connecting one or more CUs 410, one or more DUs 430, or both, as well as an O-eNB, with the Near-RT RIC 425.

In some implementations, to generate AI/ML models to be deployed in the Near-RT RIC 425, the Non-RT RIC 415 may receive parameters or external enrichment information from external servers. Such information may be utilized by the Near-RT RIC 425 and may be received at the SMO Framework 405 or the Non-RT RIC 415 from non-network data sources or from network functions. In some examples, the Non-RT RIC 415 or the Near-RT RIC 425 may be configured to tune RAN behavior or performance. For example, the Non-RT RIC 415 may monitor long-term trends and patterns for performance and employ AI/ML models to perform corrective actions through the SMO Framework 405 (such as reconfiguration via O1) or via creation of RAN management policies (such as A1 policies).

A transmitter (e.g., a UE, network node) in a wireless communication network (e.g., a 5G NR network) may transmit information bits using a modulation scheme, such as quadrature amplitude modulation (QAM). In QAM, a sequence of bits (e.g., information bits) are mapped to different modulation constellation symbols (also referred to as modulation constellation points) prior to transmission. Each modulation constellation symbol represents a unique combination of phase and amplitude of two sinusoidal carrier waves. The modulation constellation symbols may be represented in a constellation diagram as described herein with reference to FIG. 5.

Figure 5:
FIG. 5 illustrates a constellation diagram including 16 modulation constellation symbols.

FIG. 5 illustrates a constellation diagram 500 including 16 modulation constellation symbols. It should be understood that the constellation diagram 500 represents one example and that the aspects described herein may be applied to modulation schemes that include more or less than 16 modulation constellation symbols. The number of modulation constellation symbols in a constellation diagram determines the number of bits carried in each symbol. For example, since the constellation diagram 500 includes 16 modulation constellation symbols (e.g., $16=2^4$), each modulation constellation symbol in the constellation diagram 500 may carry four bits of data.

In the constellation diagram 500, it should be noted that modulation constellation symbols closest to the center point 550 may be associated with lower amplitude values than modulation constellation symbols further from the center point 550. For example, the modulation constellation symbols 512, 514, 520, 522 closest to the center point 550 may be associated with lower amplitude values than the modulation constellation symbols 502, 504, 506, 508, 510, 516, 518, 524, 526, 528, 530, 532 that are further from the center point 550. In some scenarios, the modulation constellation symbols closest to the center point 550 may provide a higher block error rate (BLER) than modulation constellation symbols that are further from the center point 550. This is because the modulation constellation symbols closest to the center point 550 may provide benefits such as improved tolerance to noise and/or nonlinearities.

In a traditional modulation operation, modulation constellation symbols in a constellation diagram are uniformly distributed. This means that each modulation constellation symbol has the same (e.g., uniform) probability of being used for transmission of data bits. Therefore, the modulation constellation symbols further from the center point 550 (e.g., modulation constellation symbols associated with higher amplitude and requiring more transmission power) have the same probability of being used as modulation constellation symbols closer to the center point 550 (e.g., modulation constellation symbols associated with lower amplitude and requiring lower transmission power).

A transmitter (e.g., a UE, network node) in a wireless communication network (e.g., a 5G NR network) may perform probabilistic shaping to improve the performance of a receiver (e.g., a UE, network node). Probabilistic shaping is a technique for controlling the probability distribution of modulation constellation symbols when modulating information bits for transmission. Therefore, by properly designing the distribution of the modulation constellation symbols, the BLER performance at a receiver may be improved.

Figure 6:
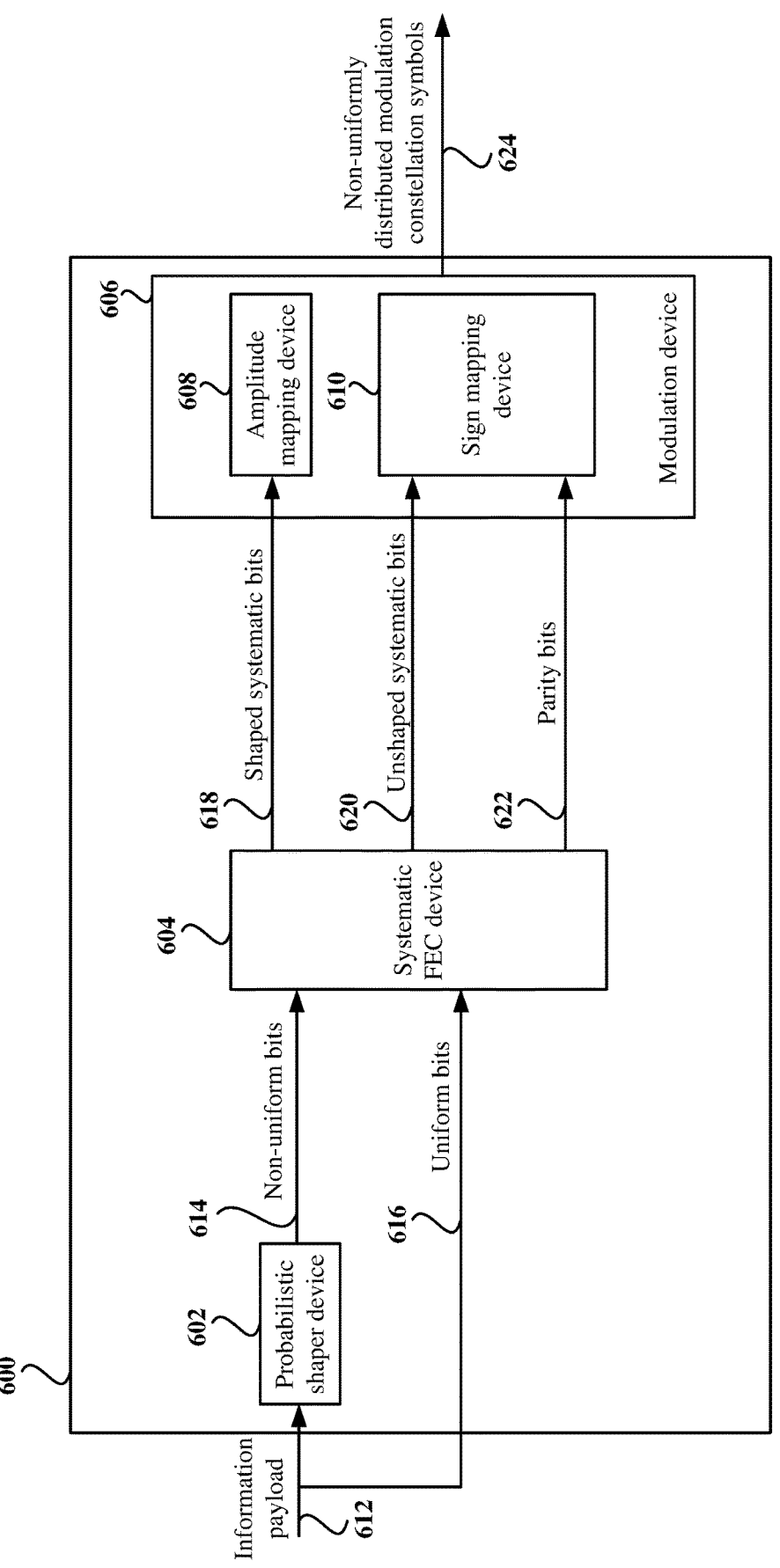
FIG. 6 is a diagram illustrating an apparatus configured to perform probabilistic shaping and modulation of an information payload.

FIG. 6 is a diagram illustrating an apparatus 600 configured to perform probabilistic shaping and modulation of an information payload. In some examples, the apparatus may be a transmitter, such as a UE, a network node (e.g., a base station), or other type of transmitter. The apparatus 600 includes a probabilistic shaper device 602, a systematic forward error correction (FEC) device 604, and a modulation device 606. The modulation device 606 includes an amplitude mapping device 608 and a sign mapping device 610.

As shown in FIG. 6, an information payload 612 including a sequence of bits may be provided to the probabilistic shaper device 602. The probabilistic shaper device 602 may be configured to shape bits that are to be mapped to an amplitude of a modulation constellation+ symbol and not shape bits (e.g., sign bits) that are to be mapped to a sign of a modulation constellation symbol. This technique may be referred to as "probabilistic amplitude shaping (PAS)". For example, the probabilistic shaper device 602 may shape the bits of the information payload 612 into non-uniform bits 614 (e.g., bits to be mapped to a real or imaginary amplitude of a modulation constellation symbol) for a non-uniform distribution of modulation constellation symbols and uniform bits 616 (e.g., bits to be mapped to a sign of a modulation constellation symbol) for a uniform distribution of modulation constellation symbols.

The systematic FEC device 604 may receive the non-uniform bits 614 and the uniform bits 616. The systematic FEC device 604 may apply a channel coding scheme (e.g., a low density parity check code (LDPC)) to the non-uniform bits 614 and the uniform bits 616 to provide shaped systematic bits 618, unshaped systematic bits 620, and parity bits 622 for the shaped systematic bits 618 and the unshaped systematic bits 620. The amplitude mapping device 608 may receive the shaped systematic bits 618 and may map the shaped systematic bits 618 to modulation constellation symbols associated with lower amplitude values (e.g., amplitude values that are less than or equal to a threshold). The sign mapping device 610 may receive the unshaped systematic bits 620 and the parity bits 622 and may map the unshaped systematic bits 620 to any available modulation constellation symbols. The modulation device 606 may indicate non-uniformly distributed modulation constellation symbols 624 (e.g., QAM constellation symbols).

In a typical hybrid automatic repeat request (HARQ) scheme, parity bits in retransmissions associated with an initial transmission (e.g., an initial transmission based on probabilistic amplitude shaping) are transmitted using uniformly distributed modulation constellation symbols. In some examples, parity bits may be distributed to modulation constellation symbols according to the design of the initial transmission (e.g., for a general probabilistic shaping scheme). Therefore, retransmissions based on an incremental redundancy (IR) HARQ (abbreviated herein as IR-HARQ) scheme may not have the benefit of the shaping gain.

A transmitter may perform a shortening operation to improve the performance of a channel coding scheme (e.g., an LDPC encoding scheme). For example, a transmitter may perform the shortening operation by inserting zeros (also referred to as zero-padding) to an information packet before encoding the information packet. After the transmitter performs an encoding operation (e.g., an LDPC encoding operation) on the information packet and provides a codeword (e.g., a codeword including systematic information bits and parity bits), the transmitter removes these zeros (also referred to as padded zeros) from the codeword and transmits the codeword. A receiver may add zeros to the codeword in the places where the transmitter removed the zeros when decoding the codeword. This is a technique used for rate matching the code to a particular rate and/or block length.

In LDPC coding, rate matching may involve shortening and puncturing operations. A transmitter may apply shortening to an information packet when needed before performing an LDPC encoding operation. For example, the transmitter may attach filler bits F at the end of an information block B to form a row vector U, where U=[B, F]. The transmitter enters the filler bits F to a circular buffer. The transmitter uses the row vector U as the input to an LDPC encoder. It should be noted that the transmitter does not transmit the filler bits F.

LDPC encoding supports built-in puncturing of systematic bits (also referred to as systematic information bits). Puncturing refers to a technique where a transmitter intentionally does not transmit certain bits of a codeword. In some examples, a transmitter may transmit coded bits of a codeword after skipping the first $N_{sys,punct}$ systematic bits of the codeword, where $N_{sys,punct}$ represents a number of systematic bits of a codeword that are not transmitted. For example, the $N_{sys,punct}$ systematic bits may represent $2 \cdot Z$ bits, where Z is a positive integer representing a lifting size. The transmitter does not enter the $N_{sys,punct}$ systematic bits into a circular buffer.

The aspects described herein provide techniques for shaping parity bits of a channel encoded codeword (e.g., an LDPC codeword). In some examples, these techniques may be applied to HARQ schemes to provide a shaping gain in HARQ retransmissions. For example, a transmitter may use shortening bits to shape the parity bits of an LDPC codeword. In some examples, the transmitter may perform a shortening operation by adding certain non-zero bits (e.g., instead of adding only zeros) to an information packet before providing the information packet to an LDPC encoder. These non-zero bits may be considered shaping bits.

A transmitter may use a channel coding scheme, such an LDPC encoding scheme, to encode k bits into a codeword of n bits. For example, k and n may be positive integers, where n>k. The codeword of n bits may be referred to as an (n, k) LDPC codeword. For example, the codeword may include the k information bits and n–k parity bits. The codeword may be associated with a parity check matrix H of size (n–k)×n, where n–k indicates the number of rows of the parity check matrix H, and where n indicates the number of columns of the parity check matrix H.

In some examples, the transmitter may perform a shortening operation prior to encoding k bits. For example, the k bits may include information bits u and shortening bits s. The information bits u and the shortening bits s may be expressed as the row vector [u, s]. In a typical shortening operation, each of the shortening bits s may be set to zero. The transmitter may encode the information bits u and the shortening bits s to generate a codeword (e.g., an LDPC codeword) containing systematic information bits (e.g., the information bits u and the shortening bits s) and parity bits p. Therefore, the codeword may be expressed as the row vector [u, s, p]. The transmitter may remove the shortening bits s from the codeword prior to transmission of the codeword. It should be noted that the codeword may include n bits, where the n bits include k bits that contain the vector [u, s] and (n–k) bits that contain the parity bits p.

The codeword (e.g., the row vector [u, s, p]) may be associated with a parity check matrix H of size (n–k)×n. The parity check matrix H may consist of three submatrices, such as a first submatrix $H_I$ associated with the information bits u, a second submatrix $H_S$ associated with the shortening bits s, and a third submatrix $H_P$ associated with the parity bits p. In this example, the parity check matrix H may be expressed as the matrix $[H_I, H_S, H_P]$.

For retransmissions of a codeword including information bits u, such as incremental redundancy HARQ (IR-HARQ) retransmissions, the transmitter may transmit one or more retransmissions including different sets of parity bits associated with the information bits u. For example, the transmitter may transmit a first retransmission that includes a set of parity bits $p_1$, a second retransmission that includes a set of parity bits $p_2$, a third retransmission that includes a set of parity bits $p_3$, and so on.

Figure 7:
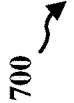
FIG. 7 is a signal flow diagram in accordance with various aspects of the disclosure.

FIG. 7 is a signal flow diagram 700 in accordance with various aspects of the disclosure. The signal flow diagram 700 includes a transmitter 702 (also referred to as a transmitter device) and a receiver 704 (also referred to as a receiver device). The transmitter 702 may be a UE, a network node (e.g., a base station) or other type of transmitter. The receiver 704 may be a UE, a network node (e.g., a base station) or other type of receiver. The transmitter 702 may optionally transmit configuration information 705 associated with a channel coding scheme (e.g., an LDPC encoding scheme). The transmitter 702 may transmit a message 706 (also referred to as an initial message transmission). In some examples, the message 706 includes a codeword (e.g., an LDPC codeword) containing systematic information bits and parity bits.

In some examples, if the receiver 704 is unable to decode the message 706, the receiver 704 may transmit a first NACK (NACK_1) 708. The transmitter 702 may transmit a first retransmission of the message 708 in response to the NACK_1 708. In some examples, the transmitter 702 may not receive the NACK_1 708 and may transmit the first retransmission of the message 708 in response to an expiration of a timer. If the receiver 704 is still unable to decode the message 706, the receiver 704 may transmit a second NACK (NACK_2) 712. The transmitter 702 may transmit a second retransmission of the message 714 in response to the NACK_2 712. In some examples, the transmitter 702 may not receive the NACK_2 712 and may transmit the second retransmission of the message 714 in response to an expiration of a timer. In some scenarios, the transmitter 702 may transmit up to an Nth retransmission of the message 718 (e.g., in response to an Nth NACK (NACK_N) 716 or an expiration of a timer).

For each retransmission (e.g., the first retransmission of the message 710, the second retransmission of the message 714, the Nth retransmission of the message 718), the transmitter 702 may be configured to include a different set of parity bits (e.g., $p_1, p_2 \ldots p_N$) and a corresponding set of shortening bits s. For example, each retransmission may include a row vector [s, p]. In the aspects described herein, each set of shortening bits s may include at least one non-zero bit and may serve as probabilistic shaping bits.

Probabilistic shaping bits refer to a set of bits appended to a transmission payload for purposes of controlling the mapping of the bits of the transmission payload to desired modulation constellation symbols. For example, a transmitter may append probabilistic shaping bits to a transmission payload so that the bits of the transmission payload are more often mapped to modulation constellation symbols closer to a center point of a constellation diagram. When probabilistic shaping bits are used to control the mapping of the bits of a transmission payload to more of a desired set of modulation constellation symbols (e.g., modulation constellation symbols closer to a center point of a constellation diagram), the mapping of the modulation constellation symbols may be said to have a non-uniform probability distribution.

In some examples, the transmitter 702 may set the values of the shortening bits s so that modulation constellation symbols used to transmit the row vector [s, p] have a non-uniform probability distribution. In this case the row vector [s, p] may be expressed as p'=[s, p]. In other words, the transmitter may use the shortening bits s as probabilistic shaping bits so that the parity bits p are more likely to be mapped to modulation constellation symbols closer to a center point of a constellation diagram.

The syndrome of a codeword c may be expressed with the following equation (1):

$$x_{c\_1} = H \cdot c^T \qquad \text{(equation 1)}$$

where $x_{c\_1}$ represents the syndrome of the codeword c, and H is a parity check matrix. The codeword c may be in the form of a row vector. If the codeword c is a valid codeword, the product of H and $c^T$ (e.g., the syndrome $x_{c\_1}$) will be zero.

The syndrome $x_{c\_2}$ of the codeword [u, p'] may be expressed with the following equation (2):

$$x_{c\_2} = [H_I, H_S, H_P] \cdot [u, p']^T \qquad \text{(equation 2)}$$

where $x_{c\_2}$ represents the syndrome of the codeword [u, p'], and $[H_I, H_S, H_P]$ is a parity check matrix. The codeword [u, p'] may be in the form of a row vector. As previously described, the shortening bits s in p'=[s, p] represent probabilistic shaping bits. If [u, p'] is a valid codeword, the product of $[H_I, H_S, H_P]$ and [u, p'] T (e.g., the syndrome $x_{c\_2}$) will be zero. From equation (2), it can be concluded that $[H_S, H_P]$ $p'^T = H_I u$.

Since the size of the first and second submatrices $[H_S, H_P]$ have a size (n–k)×(n–k+1), there are multiple different row vectors p' that satisfy the syndrome condition $[H_S, H_P]$ $p'^T = H_I u$. The transmitter 702 may set the bits of the row vector p' to achieve a descried (e.g., non-uniform) distribution of modulation constellation symbols. For example, the transmitter 702 may set the shortening bits s of the row vector p' to include at least one nonzero bit. The receiver 704 may implement a linear decoder to decode the row vector p'.

FIGS. 8A and 8B are diagrams illustrating an example of a parity check matrix 800 for a systematic LDPC code. In the example of FIGS. 8A and 8B, the parity check matrix 800 has a size of $(n_1+n_2-k)×(n_1+n_2)$ and is associated with a (k, $n_1+n_2$) LDPC code. The LDPC code is designed to encode k information bits u into $n_1+n_2$ coded bits. The parity check matrix 800 includes multiple nonoverlapping submatrices, such as a first submatrix $H_{11}$ 806, a second submatrix $H_{12}$ 808, a third submatrix $H_{13}$ 810, a fourth submatrix 812 with all zero elements, a fifth submatrix $H_{21}$ 814, a sixth submatrix $H_{22}$ 816, a seventh submatrix $H_{23}$ 818, and an eighth submatrix $H_{24}$ 820. In the parity check matrix 800, the first row 802 is associated with an initial transmission of a message (e.g., the message 706) and the second row 804 is associated with a retransmission of the message (e.g., the first retransmission of the message 710). It should be understood that the term "nonoverlapping" used herein with respect to two or more submatrices means that any element of one submatrix is not included in any other submatrix.

In the aspects described with reference to FIGS. 8A and 8B, the transmitter 702 may reserve k' bits in the k bits for information bits u and may reserve l bits in the k bits for shortening bits, such that k'+l=k. For an initial transmission of information bits u in the message 706, the transmitter 702 may set the shortening bits to zero. In other words, the transmitter 702 may set each of the l bits in the k bits to zero.

In one example, with reference to FIG. 8A, the transmitter 702 may encode information bits u for the initial transmission using the first submatrix $H_{11}$ 806 and the third submatrix $H_{13}$ 810 of the parity check matrix 800 to generate $n_1-k$ parity bits $p_0$. As previously described, the transmitter 702 may set the l shortening bits to zero when encoding the information bits u and may not transmit the l shortening bits.

For the retransmission of the message (e.g., an IR-HARQ retransmission), such as the first retransmission of the message 710, the transmitter 702 may use the fifth submatrix $H_{21}$ 814, the sixth submatrix $H_{22}$ 816, and the eighth submatrix $H_{24}$ 820 of the parity check matrix 800 for encoding and shaping of $n_2$ parity bits $p_1$.

The syndrome of the codeword [u, s, $p_0$, $p_1$] may be expressed as shown in the following equation (3):

$$[H_{21}, H_{22}, H_{23}, H_{24}] \cdot [u, s, p_0, p_1]^T = 0 \qquad \text{(equation 3)}$$

where the matrix $[H_{21}, H_{22}, H_{23}, H_{24}]$ includes the fifth submatrix $H_{21}$ 814, the sixth submatrix $H_{22}$ 816, the seventh submatrix $H_{23}$ 818, and the eighth submatrix $H_{24}$ 820 of the parity check matrix 800, and the codeword [u, s, $p_0$, $p_1$] includes k' systematic information bits u, l shaping bits s, $n_1-k$ parity bits $p_0$, and $n_2$ parity bits $p_1$. The previously described equation (3) may be rewritten to isolate the known portion of the codeword (e.g., [u, $p_0$]) as shown in the following equation (4):

$$[H_{21}, H_{23}] \cdot [u, p_0]^T = [H_{22}, H_{24}] \cdot [s, p_1]^T. \qquad \text{(equation 4)}$$

Since the values of the row vector [u, $p_0$] are fixed based on the initial transmission of the information bits u and the $n_1-k$ parity bits $p_0$, the transmitter 702 may determine one or more vectors (e.g., [s, $p_1$]) that both satisfy equation (4) above and provide a desired probability distribution (e.g., a non-uniform distribution of modulation constellation symbols). In some examples, the desired probability distribution may involve mapping the bits of the row vector [s, $p_1$] to modulation constellation symbols associated with lower amplitude values (e.g., amplitude values that are less than or equal to a threshold), such as modulation constellation symbols closer to a center of a constellation diagram, instead of modulation constellation symbols associated with higher amplitude values.

Given that the size of $[H_{22}, H_{24}]$ is $(l+n_2)×n_2$, there are multiple vectors [s, $p_1$] that will satisfy the parity check condition in equation (4) above. For example, the submatrices $H_{22}$ and $H_{24}$ may define a linear code (e.g., a low density generator matrix code). In some examples, since the expression $[H_{21}, H_{23}] \cdot [u, p_0]$ T is a syndrome, the transmitter 702 may apply syndrome decoding to the expression $[H_{22}, H_{24}] \cdot [s, p_1]$ T to determine the shaping bits s and the parity bits $p_1$. For example, the transmitter 702 may implement a syndrome decoder configured to determine values for the row vector [s, $p_1$] that satisfy the syndrome condition $[H_{21}, H_{23}] \cdot [u, p_0]$ T and which provides the desired probability distribution. The transmitter 702 may transmit at least one of the determined vectors (e.g., [s, $p_1$]) for the retransmission of the message.

In some examples, the transmitter 702 may determine values for the row vector [s, $p_1$] that satisfy the syndrome condition $[H_{21}, H_{23}]\cdot[u, p_0]$ T and which provides the desired probability distribution from at least one syndrome table (also referred to as a syndrome lookup table). For example, the syndrome table may include all possible correctable error vectors for the syndrome $[H_{21}, H_{23}]\cdot[u, p_0]^T$.

An example of a decoding operation of the message 706 and the first retransmission of the message 710 will now be described. The receiver 704 may receive the message 706 and may perform a demodulation operation to obtain a first set of likelihood ratios (LLR) values (also referred to as LLRs) associated with the message 706. In some examples, the first set of LLRs may include $n_1$–1 LLRs.

The receiver 704 may perform a decoding operation based on the first set of LLRs, the first submatrix $H_{11}$ 806, and the third submatrix $H_{13}$ 810 to decode the message 706. For example, the first submatrix $H_{11}$ 806 and the third submatrix $H_{13}$ 810 may be expressed as $[H_{11}, H_{13}]$. The receiver 704 may perform the decoding operation to obtain k' information bits u.

The receiver 704 may receive the first retransmission of the message 710 and may perform a demodulation operation to obtain a second set of LLRs associated with the first retransmission of the message 710. As described herein, the first retransmission of the message 710 may include the row vector [s, $p_1$].

The receiver 704 may combine the first set of LLRs with the second set of LLRs to obtain a combined set of LLRs and may perform a decoding operation based on the combined set of LLRs and the parity check matrix 800. Since the message 706 does not include the/shaping bits s, the receiver 704 may set the second submatrix $H_{12}$ 808 to all zero elements as indicated in FIG. 8B. It should be noted that the receiver 704 may obtain the first set of LLRs (e.g., k' LLRs associated with the information bits u and $n_1$–k LLRs associated with the parity bits $p_0$) from the message 706 and may obtain the second set of LLRs (e.g., 1 LLRs associated with the shaping bits s and $n_2$ LLRs associated with the parity bits $p_1$) from the first retransmission of the message 710.

The receiver 704 may treat the 1 shaping bits s received in the first retransmission of the message 710 as unknown information bits. After the receiver 704 completes the decoding operation, the receiver 704 may extract the k' information bits u. In some examples, the effective degree distribution of the code may be different from the original code.

In some aspects, and as previously described with reference to FIG. 7, the transmitter 702 may transmit the message 706 including information bits u and a first set of parity bits $p_0$. The transmitter 702 may transmit multiple retransmissions (e.g., IR-HARQ retransmissions) associated with the message 706. In some examples, each of the retransmissions may include a different set of error correction bits associated with the information bits u and a different set of probabilistic shaping bits s.

In one example, the transmitter 702 may encode k' information bits u to generate a codeword (e.g., an LDPC codeword) containing systematic information bits (e.g., the information bits u) and a first set of parity bits $p_0$. Therefore, the codeword may be expressed as the row vector [u, $p_0$]. In one example, the transmitter 702 may encode the k' information bits u based on a parity check matrix, which is described in detail with reference to FIGS. 9A and 9B.

Figure 9A:
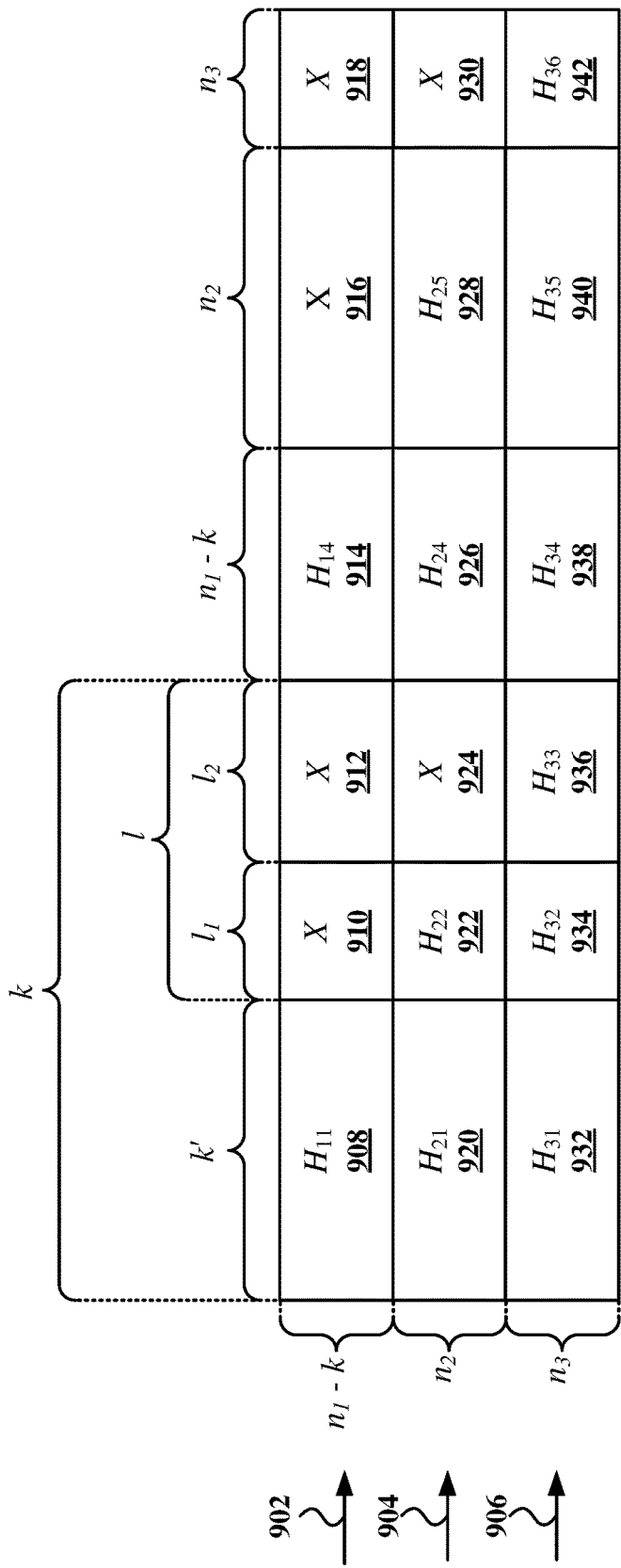
FIGS. 9A and 9B are diagrams illustrating an example of a parity check matrix for a systematic LDPC code in accordance with various aspects of the disclosure.
Figure 9B:
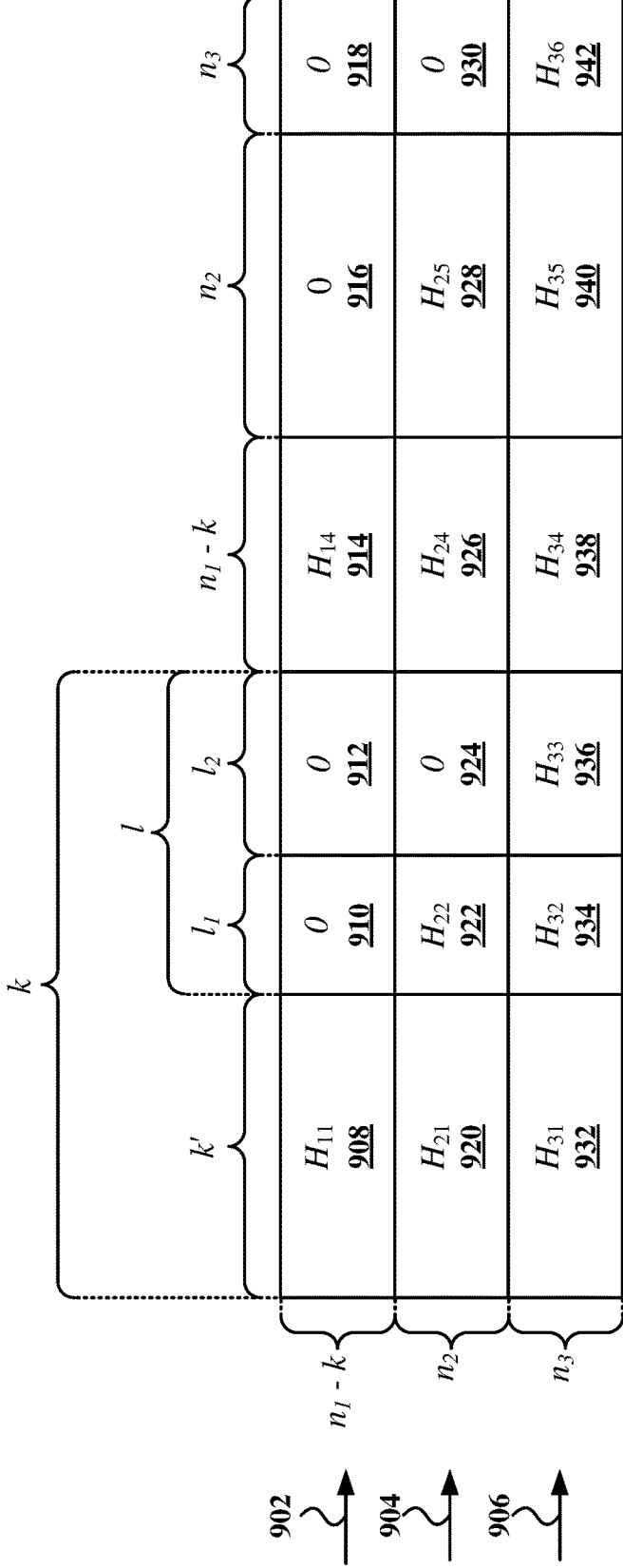

FIGS. 9A and 9B are diagrams illustrating an example of a parity check matrix 900 for a systematic LDPC code. With reference to FIG. 9A, in the parity check matrix 900, the first row 902 is associated with the message 706 (e.g., the initial transmission of the message 706), the second row 904 is associated with a first retransmission of the message 710, and the third row 906 is associated with a second retransmission of the message 712. The parity check matrix 900 includes multiple non-overlapping submatrices, such as the submatrices $H_{11}$ 908 and $H_{14}$ 914. In FIG. 9A, submatrices marked with "X" indicate submatrices that are not used when encoding.

For example, the transmitter 702 may encode the k' information bits u based on the submatrices $H_{11}$ 908 and $H_{14}$ 914 in the first row 902 of the parity check matrix 900, where the k' information bits u are associated with the submatrix $H_{11}$ 908 and the first set of parity bits $p_0$ is associated with the submatrix $H_{14}$ 914. The transmitter 702 may include the codeword (e.g., the row vector [u, $p_0$]) in the message 706.

For the first retransmission of the message 710, the transmitter 702 may determine a second set of parity bits $p_1$ associated with the information bits u and a first set of shortening bits $s_1$. For example, the first retransmission of the message 710 may include a row vector [$s_1$, $p_1$]. The first set of shortening bits $s_1$ may include at least one nonzero bit and may serve as probabilistic shaping bits.

For example, the transmitter 702 may set the values of the shortening bits $s_1$ so that modulation constellation symbols used to transmit the row vector [$s_1$, $p_1$] have a non-uniform probability distribution. In other words, the transmitter 702 may use the shortening bits $s_1$ as probabilistic shaping bits.

For example, to generate the row vector [$s_1$, $p_1$], the transmitter 702 may use the submatrices $H_{21}$ 920, $H_{22}$ 922, $H_{24}$ 926 and $H_{25}$ 928 in the second row 904 of the parity check matrix 900 and a codeword [u, $s_1$, $p_0$, $p_1$], where the k' information bits u are associated with the submatrix $H_{21}$ 920, the first set of shortening bits $s_1$ is associated with the submatrix $H_{22}$ 922, the first set of parity bits $p_0$ is associated with the submatrix $H_{24}$ 926, and the second set of parity bits $p_1$ is associated with the submatrix $H_{25}$ 928. The codeword [u, $s_1$, $p_0$, $p_1$] may be in the form of a row vector.

The syndrome of the codeword [u, $s_1$, $p_0$, $p_1$] may be expressed as shown in the following equation (5):

$$[H_{21}, H_{22}, H_{23}, H_{24}]\cdot[u, s_1, p_0, p_1]^T = 0 \qquad \text{(equation 5)}$$

where the matrix $[H_{21}, H_{22}, H_{23}, H_{24}]$ includes the submatrices $H_{21}$ 920, $H_{22}$ 922, $H_{24}$ 926, and $H_{25}$ 928 of the parity check matrix 900, and the codeword [u, $s_1$, $p_0$, $p_1$] includes k' systematic information bits u, $1_1$ shortening bits $s_1$, $n_1$–k parity bits $p_0$, and $n_2$ parity bits $p_1$. The previously described equation (5) may be rewritten to isolate the known portion of the codeword (e.g., [u, $p_0$]) as shown in the following equation (6):

$$[H_{21}, H_{23}]\cdot[u, p_0]^T = [H_{22}, H_{24}]\cdot[s_1, p_1]^T. \qquad \text{(equation 6)}$$

Since the values of the row vector [u, $p_0$] are fixed based on the initial transmission of the message 706 including the information bits u and the $n_1$–k parity bits $p_0$, the transmitter

702 may determine one or more vectors (e.g., $[s_1, p_1]$) that both satisfy the equation (6) above and provide a desired probability distribution (e.g., a non-uniform distribution of modulation constellation symbols). In some examples, the desired probability distribution may involve mapping the bits of the row vector $[s_1, p_1]$ to modulation constellation symbols associated with lower amplitude values (e.g., amplitude values that are less than or equal to a threshold), such as modulation constellation symbols closer to a center of a constellation diagram, instead of modulation constellation symbols associated with higher amplitude values.

Multiple vectors $[s_1, p_1]$ may satisfy the parity check condition in the equation (6) above. For example, the submatrices $H_{22}$ and $H_{24}$ may define a linear code (e.g., a low density generator matrix code). In some examples, since the expression $[H_{21}, H_{23}] \cdot [u, p_0]$ T is a syndrome, the transmitter 702 may apply syndrome decoding to the expression $[H_{22}, H_{24}]^*[s_1, p_1]$ T to determine the shaping bits $s_1$ and the parity bits $p_1$. In some examples, since the expression $[H_{21}, H_{23}] \cdot [u, p_0]^{TM}$ is a syndrome, the transmitter 702 may apply syndrome decoding to the expression $[H_{22}, H_{24}]^*[s_1, p_1]$ T to determine the shaping bits $s_1$ and the parity bits $p_1$. For example, the transmitter 702 may implement a syndrome decoder configured to determine values for the row vector $[s_1, p_1]$ that satisfy the syndrome condition $[H_{21}, H_{23}] \cdot [u, p_0]$ T and which provides the desired probability distribution. The transmitter 702 may transmit at least one of the determined vectors (e.g., $[s_1, p_1]$) for the first retransmission of the message 710. Therefore, the first retransmission of the message 710 may include the vector $[s_1, p_1]$.

In some examples, the transmitter 702 may determine values for the row vector $[s_1 > p_1]$ that satisfy the syndrome condition $[H_{21}, H_{23}] \cdot [u, p_0]^T$ and which provides the desired probability distribution from at least one syndrome table (also referred to as a syndrome lookup table). For example, the syndrome table may include all possible correctable error vectors for the syndrome $[H_{21}, H_{23}] \cdot [u, p_0]^T$.

For the second retransmission of the message 714, the transmitter 702 may determine a third set of parity bits $p_2$ associated with the information bits u and a second set of shortening bits $s_2$. For example, the second retransmission of the message 714 may include a row vector $[s_2, p_2]$. The second set of shortening bits $s_2$ may include at least one nonzero bit and may serve as probabilistic shaping bits.

For example, the transmitter 702 may set the values of the shortening bits $s_2$ so that modulation constellation symbols used to transmit the row vector $[s_2, p_2]$ have a non-uniform probability distribution. In other words, the transmitter 702 may use the second set of shortening bits $s_2$ as probabilistic shaping bits.

For example, to generate the row vector $[s_2, p_2]$, the transmitter 702 may use the submatrices $H_{31}$ 932, $H_{32}$ 934, $H_{33}$ 936, $H_{34}$ 938, $H_{35}$ 940 and $H_{36}$ 942 in the third row 906 of the parity check matrix 900 and a codeword $[u, s_1, s_1, p_0, p_1, p_2]$, where k' information bits u are associated with the submatrix $H_{31}$ 932, the first set of shortening bits $s_1$ is associated with the submatrix $H_{32}$ 934, the second set of shortening bits $s_2$ is associated with the submatrix $H_{33}$ 936, the first set of parity bits $p_0$ is associated with the submatrix $H_{34}$ 938, the second set of parity bits $p_1$ is associated with the submatrix $H_{35}$ 940, and the third set of parity bits $p_2$ is associated with the submatrix $H_{36}$ 942.

The syndrome of the codeword $[u, s_1, s_2, p_0, p_1, p_2]$ may be expressed as shown in the following equation (7):

$$[H_{31}, H_{32}, H_{33}, H_{34}, H_{35}, H_{36}] \cdot [u, s_1, s_2, p_0, p_1, p_2]^T = 0 \quad \text{(equation 7)}$$

where the matrix $[H_{31}, H_{32}, H_{33}, H_{34}, H_{35}, H_{36}]$ includes the submatrices $H_{31}$ 932, $H_{32}$ 934, $H_{33}$ 936, $H_{34}$ 938, $H_{35}$ 940, $H_{36}$ 942 of the parity check matrix 900, and the codeword $[u, s_1, s_2, p_0, p_1, p_2]$ includes k' systematic information bits u, $l_1$ shortening bits $s_1$, $l_2$ shortening bits $s_2$, $n_1-k$ parity bits $p_0$, $n_2$ parity bits $p_1$, and $n_3$ parity bits $p_2$. In some examples, $l=l_1+l_2$ and $l_1=l_2$. The previously described equation (7) may be rewritten to isolate the known portion of the codeword (e.g., $[u, s_1, p_0, p_1]$) as shown in the following equation (8):

$$[H_{31}, H_{32}, H_{34}, H_{35}] \cdot [u, s_1, p_0, p_1]^T = [H_{33}, H_{36}] \cdot [s_2, p_2]^T. \quad \text{(equation 8)}$$

Since the values of the row vector $[u, s_1, p_0, p_1]$ in the equation (8) above are fixed based on the initial transmission of the message 706 containing the k' systematic information bits u and the $n_1-k$ parity bits $p_0$ and based on the first retransmission of the message 710 containing the $l_1$ shortening bits $s_1$ and the $n_2$ parity bits $p_1$, the transmitter 702 may determine one or more vectors (e.g., $[s_2, p_2]$) that both satisfy the equation (8) above and provide a desired probability distribution (e.g., a non-uniform distribution of modulation constellation symbols). In some examples, the desired probability distribution may involve mapping the bits of the row vector $[s_2, p_2]$ to modulation constellation symbols associated with lower amplitude values (e.g., amplitude values that are less than or equal to a threshold), such as modulation constellation symbols closer to a center of a constellation diagram, instead of modulation constellation symbols associated with higher amplitude values.

Multiple vectors $[s_2, p_2]$ may satisfy the parity check condition in the equation (8) above. For example, the submatrices $H_{33}$ 936 and $H_{36}$ 942 may define a linear code (e.g., a low density generator matrix code). In some examples, since the expression $[H_{31}, H_{32}, H_{34}, H_{35}] \cdot [u, s_1, p_0, p_1]$ T is a syndrome, the transmitter 702 may apply syndrome decoding to the expression $[H_{33}, H_{36}] \cdot [s_2, p_2]$ T to determine the shaping bits $s_2$ and the parity bits $p_2$. For example, the transmitter 702 may implement a syndrome decoder configured to determine values for the row vector $[s_2, p_2]$ that satisfy the syndrome condition $[H_{31}, H_{32}, H_{34}, H_{35}] \cdot [u, S1 > p_0, p_1]$ T and which provides the desired probability distribution. The transmitter 702 may transmit at least one of the determined vectors (e.g., $[s_2, p_2]$) for the second retransmission of the message 714. Therefore, the second retransmission of the message 714 may include the vector $[s_2, p_2]$.

In some examples, the transmitter 702 may determine values for the row vector $[s_2, p_2]$ that satisfy the syndrome condition $[H_{31}, H_{32}, H_{34}, H_{35}] \cdot [u, s_1, p_0, p_1]$ T and which provides the desired probability distribution from at least one syndrome table (also referred to as a syndrome lookup table). For example, the syndrome table may include all possible correctable error vectors for the syndrome $[H_{31}, H_{32}, H_{34}, H_{35}] \cdot [u, s_1, p_0, p_1]$ T.

An example of a decoding operation of the message 706, the first retransmission of the message 710, and the second retransmission of the message 714 will now be described. The receiver 704 may receive the message 706 and may perform a demodulation operation to obtain a first set of LLRs associated with the message 706. In some examples, the first set of LLRs values may include $n_1-1$ LLRs.

The receiver 704 may perform a decoding operation based on the first set of LLRs and the submatrices $H_{11}$ 908 and $H_{14}$ 914 to decode the message 706. For example, the submatrices $H_{11}$ 908 and $H_{14}$ 914 may be expressed as $[H_{11}, H_{14}]$. The receiver 704 may perform the decoding operation to obtain k' information bits u.

The receiver 704 may receive the first retransmission of the message 710 and may perform a demodulation operation to obtain a second set of LLRs associated with the first retransmission of the message 710. As described herein, the first retransmission of the message 710 may include the row vector $[s_1, p_1]$.

The receiver 704 may combine the first set of LLRs with the second set of LLRs to obtain a first combined set of LLRs and may perform a decoding operation based on the first combined set of LLRs and the parity check matrix 900. Since the message 706 does not include the 1 shaping bits $s_1$, the $l_2$ shaping bits $s_2$, the $n_2$ parity bits $p_1$, and the $n_3$ parity bits $p_2$, the receiver 704 may set the submatrices 910, 912, 916, 918 to all zero elements as indicated in FIG. 9B. Furthermore, since the first retransmission of the message 710 does not include the $l_2$ shaping bits $s_2$ and the ns parity bits $p_2$, the receiver 704 may set the submatrices 924 and 930 to all zero elements as indicated in FIG. 9B.

It should be noted that the receiver 704 may obtain the first set of LLRs (e.g., k' LLRs associated with the information bits u and $n_1-k$ LLRs associated with the parity bits $p_0$) from the message 706. The receiver 704 may obtain the second set of LLRs (e.g., 1, LLRs associated with the shaping bits $s_1$ and $n_2$ LLRs associated with the parity bits $p_1$) from the first retransmission of the message 710.

The receiver 704 may obtain the third set of LLRs (e.g., 12 LLRs associated with the shaping bits $s_2$ and $n_3$ LLRs associated with the parity bits $p_2$) from the second retransmission of the message 714. The receiver 704 may combine the first set of LLRs, the second set of LLRs, and the third set of LLRs to obtain a second combined set of LLRs and may perform a decoding operation based on the second combined set of LLRs and the parity check matrix 900

The receiver 704 may treat the $l_1$ bits of the shaping bits $s_1$ received in the first retransmission of the message 710 and the $l_2$ bits of the shaping bits $s_2$ received in the second retransmission of the message 714 as unknown information bits. After the receiver 704 completes the decoding operation, the receiver 704 may extract the k' information bits u. In some examples, the effective degree distribution of the code may be different from the original code.

In some aspects of the disclosure, the transmitter 702 and the receiver 704 may agree on the number of reserved bits in an initial transmission of a message and/or any subsequent retransmissions of the message. For example, with reference to FIG. 7, the transmitter 702 may transmit configuration information 705 indicating a number of reserved bits in an initial transmission of a message and/or any subsequent retransmissions of the message.

In some examples, the configuration information 705 may be indicated using one or more dedicated bits in DCI. For example, the one or more dedicated bits in DCI may indicate a number of shortening bits $(l_1, l_2, \ldots l_N)$ for each retransmission. In some examples, the configuration information 705 may be indicated within a modulation and coding scheme (MCS) field. For example, the transmitter 702 may extend at least one table for an MCS index and/or may add one or more values for each MCS index. In some examples, the configuration information 705 may be indicated within a new field in DCI. For example, the transmitter 702 may create a separate table for indication of shortening bits $(l_1, l_2, \ldots l_N)$ within RRC and may indicate the separate table within the new field in DCI.

FIG. 10 is a flowchart 1000 of a method of wireless communication. The method may be performed by a transmitter (e.g., the transmitter 702; the apparatus 1202/1202'; the processing system 1314). In some examples, the transmitter may be implemented as a UE (e.g., the UE 104). In these examples, the transmitter may include the memory 360 and may be the entire UE or a component of the UE, such as the TX processor 368, the RX processor 356, and/or the controller/processor 359). In some examples, the transmitter may be implemented as a network node (e.g., the base station 102, the RU 440). In these examples, the transmitter may include the memory 376 and may be the entire network node or a component of the network node, such as the TX processor 316, the RX processor 370, and/or the controller/processor 375). In FIG. 10, it should be understood that blocks indicated with dashed lines represent optional blocks.

At 1002, the transmitter transmits configuration information indicating at least one size of a set of probabilistic shaping bits for each retransmission of a first message. For example, with reference to FIG. 7, the configuration information may be the configuration information 705 transmitted from the transmitter 702. In some examples, configuration information may indicate a number of reserved bits (e.g., 1 reserved bits associated with a shortening operation for probabilistic shaping) in an initial transmission of a message (e.g., the message 706 shown in FIG. 7) and/or any subsequent retransmissions of the message (e.g., the first retransmission of the message 710, the second retransmission of the message 714, the Nth retransmission of the message 718 shown in FIG. 7).

In some examples, the configuration information may be indicated using one or more dedicated bits in DCI and/or within a modulation and coding scheme (MCS) field. For example, the configuration information may include a table for indication of shortening bits $(l_1, l_2, \ldots l_N)$.

At 1004, the transmitter transmits a first message including information bits and a first set of error correction bits associated with the information bits. In the aspects described with reference to FIGS. 8A and 8B, the transmitter 702 may reserve k' bits of k information bits u for information bits and may reserve 1 bits of the k bits for shortening bits, such that k'+1=k. For an initial transmission of information bits u in the message 706, the transmitter 702 may set the shortening bits to zero. In other words, the transmitter 702 may set each of the 1 bits in the k bits to zero.

In one example, with reference to FIG. 8A, the transmitter 702 may encode information bits u for the initial transmission using the first submatrix $H_{11}$ 806 and the third submatrix $H_{13}$ 810 of the parity check matrix 800 to generate $n_1-k$ parity bits $p_0$ to generate a codeword (e.g., an LDPC codeword) represented by the row vector $[u, p_0]$. As previously described, the transmitter 702 may set the 1 shortening bits to zero when encoding the information bits u and may not transmit the 1 shortening bits. For example, with reference to FIG. 7, the transmitter may transmit the message 706 including the row vector $[u, p_0]$.

At 1006, the transmitter obtains the set of probabilistic shaping bits. The probabilistic shaping bits are based on a first submatrix and a second submatrix of a parity check matrix, wherein the first submatrix is associated with the set of probabilistic shaping bits and the second submatrix is associated with a second set of error correction bits. For example, with reference to FIGS. 8A and 8B, the transmitter may obtain the set of probabilistic shaping bits based on the sixth submatrix $H_{22}$ 816 and the eighth submatrix $H_{24}$ 820. In this example, and with reference to the equation (4) described herein, the transmitter may apply syndrome decoding to the expression $[H_{22}, H_{24}] \cdot [s, p_1]$ T to determine the shaping bits s and the parity bits $p_1$. For example, the transmitter may implement a syndrome decoder configured to determine values for the row vector $[s, p_1]$ that satisfy the syndrome condition $[H_{21}, H_{23}] \cdot [u, p_0]^T$ and which provides the desired probability distribution.

In some examples, a first syndrome of the set of probabilistic shaping bits and the second set of error correction bits is equal to a second syndrome of the set of information bits and the first set of error correction bits. For example, the first syndrome of the set of probabilistic shaping bits and the second set of error correction bits is based on the first submatrix and the second submatrix, and the second syndrome of the set of information bits and the first set of error correction bits is based on a third submatrix and a fourth submatrix of the parity check matrix. In some examples, the first submatrix, the second submatrix, the third submatrix, and the fourth submatrix are nonoverlapping. In some examples, the set of probabilistic shaping bits are included in a preconfigured number of reserved bits associated with a shortening operation.

At 1008, the transmitter transmits at least a second message associated with the first message, wherein the second message includes the second set of error correction bits (e.g., the parity bits $p_1$) associated with the information bits and the set of probabilistic shaping bits (e.g., the shaping bits s) for the second set of error correction bits. In some examples, the second message may be a IR-HARQ retransmission of the first message and, therefore, the second message may represent a first retransmission of the first message. For example, with reference to FIG. 7, the transmitter may transmit the first retransmission of the message 708 including the row vector $[s, p_1]$.

FIG. 11 is a flowchart 1100 of a method of wireless communication. The method may be performed by a transmitter (e.g., the transmitter 702; the apparatus 1202/1202'; the processing system 1314). In some examples, the transmitter may be implemented as a UE (e.g., the UE 104). In these examples, the transmitter may include the memory 360 and may be the entire UE or a component of the UE, such as the TX processor 368, the RX processor 356, and/or the controller/processor 359). In some examples, the transmitter may be implemented as a network node (e.g., the base station 102, the RU 440). In these examples, the transmitter may include the memory 376 and may be the entire network node or a component of the network node, such as the TX processor 316, the RX processor 370, and/or the controller/processor 375).

At 1102, the transmitter transmits a message including information bits and a set of error correction bits associated with the information bits. For example, the message may be the message 706 shown in FIG. 7. For example, with reference to FIGS. 9A and 9B, the transmitter may encode k' information bits u based on the submatrices $H_{11}$ 908 and $H_{14}$ 914 in the first row 902 of the parity check matrix 900, where the k' information bits u are associated with the submatrix $H_{11}$ 908 and the first set of parity bits $p_0$ is associated with the submatrix $H_{14}$ 914. The transmitter 702 may include the codeword (e.g., the row vector $[u, p_0]$) in the message 706.

At 1104, the transmitter transmits one or more subsequent messages associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution.

In some examples, with reference to FIG. 7, the one or more subsequent messages may include the first retransmission of the message 710, the second retransmission of the message 714, and/or the Nth retransmission of the message 718. For example, the first retransmission of the message 710 may include the row vector $[s_1, p_1]$, the second retransmission of the message 714 may include the row vector $[s_2, p_2]$, and the Nth retransmission of the message 718 may include a row vector $[s_N, p_N]$.

Figure 12:
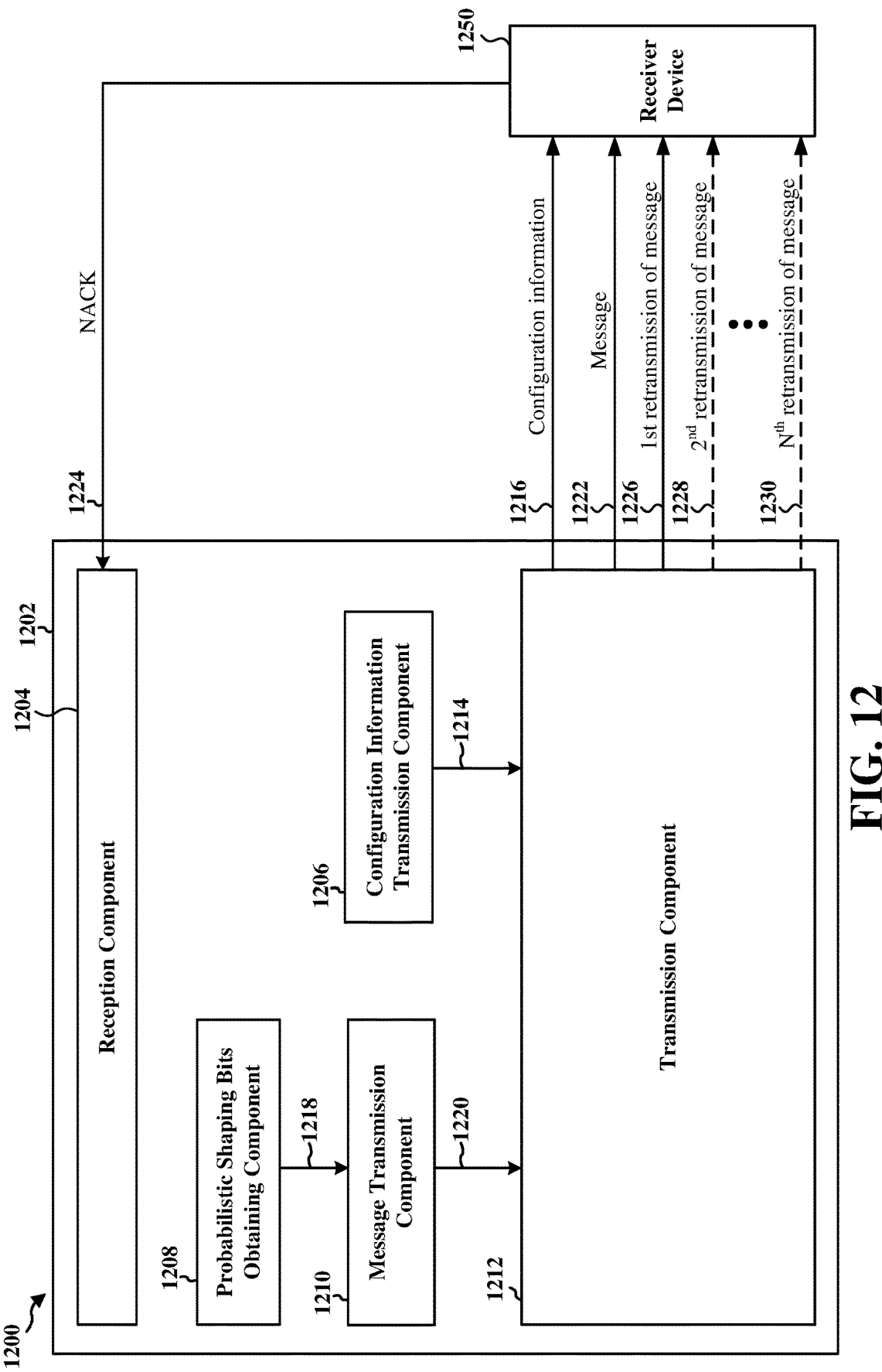
FIG. 12 is a conceptual data flow diagram illustrating the data flow between different means/components in an example apparatus.

FIG. 12 is a conceptual data flow diagram 1200 illustrating the data flow between different means/components in an example apparatus 1202. The apparatus may be a transmitter device, such as a UE, a network node (e.g., a base station), or other suitable type of transmitter device.

The apparatus includes a reception component 1204 that receives signals from a receiver device (e.g., a UE, a network node such as a base station, etc.). In some examples, the signals may include a NACK 1224. The apparatus further includes a configuration information transmission component 1206 that transmits configuration information 1214 (e.g., via the transmission component 1212 and the signal 1216) indicating at least one size of the set of probabilistic shaping bits for each retransmission of the first message, wherein a size of the first submatrix is based on the at least one size of the set of probabilistic shaping bits. In some examples, the configuration information 1214 may indicate a size of the different set of probabilistic shaping bits.

The apparatus further includes a probabilistic shaping bits obtaining component 1208 that obtains a set of probabilistic shaping bits 1218 based on a first submatrix and a second submatrix of a parity check matrix, wherein the first submatrix is associated with the set of probabilistic shaping bits and the second submatrix is associated with the second set of error correction bits.

The apparatus further includes a message transmission component 1210 that transmits one or more messages to the receiver device 1250 via a 1220 and the transmission component 1212. In some examples, the message transmission component 1210 transmits a first message (e.g., a message 1222) including information bits and a first set of error correction bits associated with the information bits and transmits at least a second message (e.g., a first retransmission of message 1226) associated with the first message, wherein the second message includes a second set of error correction bits associated with the information bits and a set of probabilistic shaping bits for the second set of error correction bits. The message transmission component 1210 further transmits one or more subsequent messages (e.g., the first retransmission of message 1226, the second retransmission of message 1228, the Nth retransmission of message 1230) associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution. The message transmission component 1210 may receive the set of probabilistic shaping bits 1218 from the probabilistic shaping bits obtaining component 1208.

The apparatus further includes a transmission component 1212 that transmits signals to the receiver device 1250.

The apparatus may include additional components that perform each of the blocks of the algorithm in the aforementioned flowcharts of FIGS. 10 and 11. As such, each block in the aforementioned flowcharts of FIGS. 10 and 11 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 13:
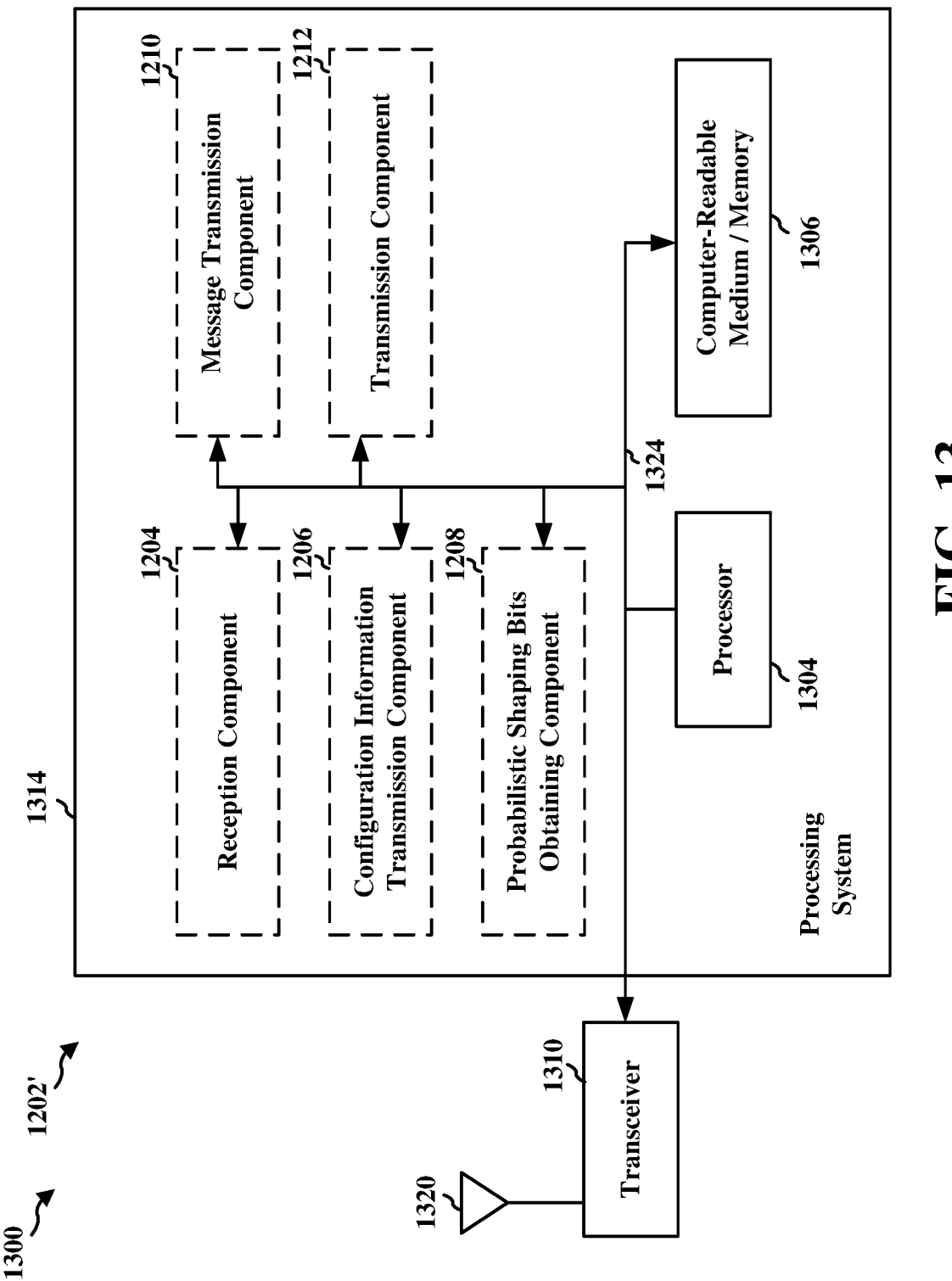
FIG. 13 is a diagram illustrating an example of a hardware implementation for an apparatus employing a processing system.

FIG. 13 is a diagram 1300 illustrating an example of a hardware implementation for an apparatus 1202' employing a processing system 1314. The processing system 1314 may be implemented with a bus architecture, represented generally by the bus 1324. The bus 1324 may include any number of interconnecting buses and bridges depending on the specific application of the processing system 1314 and the overall design constraints. The bus 1324 links together various circuits including one or more processors and/or hardware components, represented by the processor 1304, the components 1204, 1206, 1208, 1210, 1212 and the computer-readable medium/memory 1306. The bus 1324 may also link various other circuits such as timing sources, peripherals, voltage regulators, and power management circuits, which are well known in the art, and therefore, will not be described any further.

The processing system 1314 may be coupled to a transceiver 1310. The transceiver 1310 is coupled to one or more antennas 1320. The transceiver 1310 provides a means for communicating with various other apparatus over a transmission medium. The transceiver 1310 receives a signal from the one or more antennas 1320, extracts information from the received signal, and provides the extracted information to the processing system 1314, specifically the reception component 1204 In addition, the transceiver 1310 receives information from the processing system 1314, specifically the transmission component 1212, and based on the received information, generates a signal to be applied to the one or more antennas 1320. The processing system 1314 includes a processor 1304 coupled to a computer-readable medium/memory 1306. The processor 1304 is responsible for general processing, including the execution of software stored on the computer-readable medium/memory 1306. The software, when executed by the processor 1304, causes the processing system 1314 to perform the various functions described supra for any particular apparatus. The computer-readable medium/memory 1306 may also be used for storing data that is manipulated by the processor 1304 when executing software. The processing system 1314 further includes at least one of the components 1204, 1206, 1208, 1210, 1212. The components may be software components running in the processor 1304, resident/stored in the computer readable medium/memory 1306, one or more hardware components coupled to the processor 1304, or some combination thereof.

In some examples, the processing system 1314 may be implemented in a network node (e.g., a base station). In these examples, the processing system 1314 may be a component of the base station 310 and may include the memory 376 and/or at least one of the TX processor 316, the RX processor 370, and the controller/processor 375. Alternatively, the processing system 1314 may be the entire base station (e.g., see 310 of FIG. 3). In some examples, the processing system 1314 may be implemented in a UE. In these examples, the processing system 1314 may be a component of the UE 350 and may include the memory 360 and/or at least one of the TX processor 368, the RX processor 356, and the controller/processor 359. Alternatively, the processing system 1314 may be the entire UE (e.g., see 350 of FIG. 3).

In one configuration, the apparatus 1202/1202' for wireless communication includes means for transmitting a first message including information bits and a first set of error correction bits associated with the information bits, means for transmitting at least a second message associated with the first message, wherein the second message includes a second set of error correction bits associated with the information bits and a set of probabilistic shaping bits for the second set of error correction bits, means for obtaining the set of probabilistic shaping bits based on a first submatrix and a second submatrix of a parity check matrix, wherein the first submatrix is associated with the set of probabilistic shaping bits and the second submatrix is associated with the second set of error correction bits, means for transmitting configuration information indicating at least one size of the set of probabilistic shaping bits for each retransmission of the first message, wherein a size of the first submatrix is based on the at least one size of the set of probabilistic shaping bits, means for transmitting one or more subsequent messages associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution, and means for transmitting configuration information indicating a size of the different set of probabilistic shaping bits. The aforementioned means may be one or more of the aforementioned components of the apparatus 1202 and/or the processing system 1314 of the apparatus 1202' configured to perform the functions recited by the aforementioned means.

In some examples, the apparatus 1202/1202' may be implemented as a network node (e.g., a base station). In these examples, and as described supra, the processing system 1314 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

In some examples, the apparatus 1202/1202' may be implemented as a UE. In these examples, and as described supra, the processing system 1314 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Figure 14:
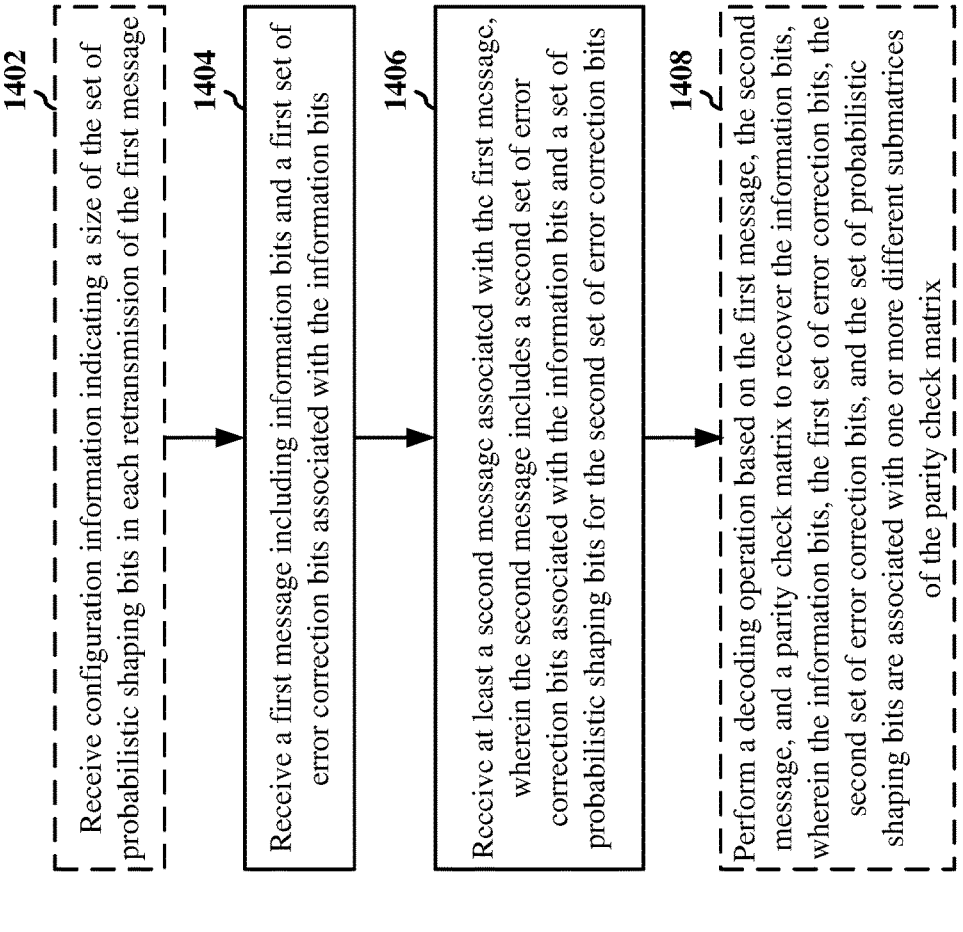
FIG. 14 is a flowchart of a method of wireless communication.

FIG. 14 is a flowchart 1400 of a method of wireless communication. The method may be performed by a receiver (e.g., the receiver 704; the apparatus 1602/1602'; the processing system 1714). In some examples, the receiver may be implemented as a UE (e.g., the UE 104). In these examples, the receiver may include the memory 360 and may be the entire UE or a component of the UE, such as the TX processor 368, the RX processor 356, and/or the controller/processor 359). In some examples, the receiver may be implemented as a network node (e.g., the base station 102, the RU 440). In these examples, the receiver may include the memory 376 and may be the entire network node or a component of the network node, such as the TX processor 316, the RX processor 370, and/or the controller/processor 375). In FIG. 14, it should be understood that blocks indicated with dashed lines represent optional blocks.

At 1402, the receiver receives configuration information indicating a size of the set of probabilistic shaping bits in each retransmission of the first message. For example, with reference to FIG. 7, the configuration information may be the configuration information 705 received at the receiver 704. In some examples, configuration information may indicate a number of reserved bits (e.g., l reserved bits associated with a shortening operation for probabilistic shaping) in an initial transmission of a message (e.g., the message 706 shown in FIG. 7) and/or any subsequent retransmissions of the message (e.g., the first retransmission of the message 710, the second retransmission of the message 714, the Nth retransmission of the message 718 shown in FIG. 7).

In some examples, the configuration information may be indicated using one or more dedicated bits in DCI and/or within a modulation and coding scheme (MCS) field. For example, the configuration information may include a table for indication of shortening bits $(l_1, l_2, \ldots l_N)$.

At 1404, the receiver receives a first message including information bits and a first set of error correction bits associated with the information bits. For example, with reference to FIG. 7 and the examples described with reference to FIGS. 8A and 8B, the receiver 704 may receive the message 706 including the row vector $[u, p_0]$.

At 1406, the receiver receives at least a second message associated with the first message, wherein the second message includes a second set of error correction bits associated with the information bits and a set of probabilistic shaping bits for the second set of error correction bits. In some examples, the second message may be a IR-HARQ retransmission of the first message and, therefore, the second message may represent a first retransmission of the first message. For example, with reference to FIG. 7, the receiver may receive the first retransmission of the message 708 including the row vector $[s, p_1]$.

At 1408, the receiver performs a decoding operation based on the first message, the second message, and a parity check matrix to recover the information bits, wherein the information bits, the first set of error correction bits, the second set of error correction bits, and the set of probabilistic shaping bits are associated with one or more different submatrices of the parity check matrix. In some examples, the receiver may perform the decoding operation by obtaining (e.g., via a demodulation operation) a first set of LLRs from the first message and a second set of LLRs from the second message and by combining the first set of LLRs and the second set of LLRs.

For example, with reference to FIGS. 7 and 8B, the receiver 704 may combine the first set of LLRs with the second set of LLRs to obtain a combined set of LLRs and may perform a decoding operation (e.g., an LDPC decoding operation) based on the combined set of LLRs and the parity check matrix 800. Since the message 706 does not include the l shaping bits s, the receiver 704 may set the second submatrix $H_{12}$ 808 to all zero elements as indicated in FIG. 8B. It should be noted that the receiver 704 may obtain the first set of LLRs (e.g., k' LLRs associated with the information bits u and $n_1-k$ LLRs associated with the parity bits $p_0$) from the message 706 and may obtain the second set of LLRs (e.g., l LLRs associated with the shaping bits s and $n_2$ LLRs associated with the parity bits $p_1$) from the first retransmission of the message 710.

The receiver 704 may treat the l shaping bits s received in the first retransmission of the message 710 as unknown information bits. After the receiver 704 completes the decoding operation, the receiver 704 may extract the k' information bits u.

FIG. 15 is a flowchart 1500 of a method of wireless communication. The method may be performed by a receiver (e.g., the receiver 704; the apparatus 1602/1602'; the processing system 1714). In some examples, the receiver may be implemented as a UE (e.g., the UE 104). In these examples, the receiver may include the memory 360 and may be the entire UE or a component of the UE, such as the TX processor 368, the RX processor 356, and/or the controller/processor 359). In some examples, the receiver may be implemented as a network node (e.g., the base station 102, the RU 440). In these examples, the receiver may include the memory 376 and may be the entire network node or a component of the network node, such as the TX processor 316, the RX processor 370, and/or the controller/processor 375).

At 1502, the receiver receives configuration information indicating a size of the different set of probabilistic shaping bits. For example, with reference to FIG. 7, the configuration information may be the configuration information 705 received at the receiver 704. In some examples, configuration information may indicate a number of reserved bits (e.g., l reserved bits associated with a shortening operation for probabilistic shaping) in an initial transmission of a message (e.g., the message 706 shown in FIG. 7) and/or any subsequent retransmissions of the message (e.g., the first retransmission of the message 710, the second retransmission of the message 714, the Nth retransmission of the message 718 shown in FIG. 7).

In some examples, the configuration information may be indicated using one or more dedicated bits in DCI and/or within a modulation and coding scheme (MCS) field. For example, the configuration information may include a table for indication of shortening bits $(l_1, l_2, \ldots l_N)$.

At 1504, the receiver receives a message including information bits and a set of error correction bits associated with the information bits. For example, with reference to FIG. 7 and the examples described with reference to FIGS. 8A and 8B, the receiver 704 may receive the message 706 including the row vector $[u, p_0]$.

At 1506, the receiver receives one or more subsequent messages associated with the message, wherein each of the one or more subsequent messages includes a different set of error correction bits associated with the information bits and a different set of probabilistic shaping bits, wherein the different set of probabilistic shaping bits enables reception of the one or more subsequent messages based on modulation constellation symbols with a non-uniform probability distribution.

In some examples, with reference to FIG. 7, the one or more subsequent messages may include the first retransmission of the message 710, the second retransmission of the message 714, and/or the Nth retransmission of the message 718. For example, the first retransmission of the message 710 may include a row vector $[s_1, p_1]$, the second retransmission of the message 714 may include a row vector $[s_2, p_2]$, and the Nth retransmission of the message 718 may include a row vector $[s_N, p_N]$.

At 1508, the receiver performs a decoding operation based on the message, the one or more subsequent messages, and a parity check matrix to recover the information bits, wherein the information bits, the different set of error correction bits, and the different set of probabilistic shaping bits are associated with one or more different submatrices of the parity check matrix.

For example, with reference to FIG. 7, the receiver 704 may receive the message 706 and may perform a demodulation operation to obtain a first set of LLRs associated with the message 706. In some examples, the first set of LLRs values may include $n_1-1$ LLRs. For example, the receiver may perform a decoding operation (e.g., an LDPC decoding operation) based on the first set of LLRs and the submatrices $H_{11}$ 908 and $H_{14}$ 914 to decode the message 706. The receiver 704 may perform the decoding operation to obtain k' information bits u.

The receiver 704 may receive the first retransmission of the message 710 and may perform a demodulation operation to obtain a second set of LLRs associated with the first retransmission of the message 710. As described herein, the first retransmission of the message 710 may include the row vector $[s_1, p_1]$. The receiver 704 may combine the first set of LLRs with the second set of LLRs to obtain a first combined set of LLRs and may perform a decoding operation based on the first combined set of LLRs and the parity check matrix 900. Since the message 706 does not include the $l_1$ shaping bits $s_1$, the $l_2$ shaping bits $s_2$, the $n_2$ parity bits $p_1$, and the $n_3$ parity bits $p_2$, the receiver 704 may set the submatrices 910, 912, 916, 918 to all zero elements as indicated in FIG. 9B. Furthermore, since the first retransmission of the message 710 does not include the $l_2$ shaping bits $s_2$ and the $n_3$ parity bits $p_2$, the receiver 704 may set the submatrices 924 and 930 to all zero elements as indicated in FIG. 9B.

The receiver 704 may obtain the third set of LLRs (e.g., 12 LLRs associated with the shaping bits $s_2$ and $n_3$ LLRs associated with the parity bits $p_2$) from the second retransmission of the message 714. The receiver 704 may treat the $l_1$ bits of the shaping bits $s_1$ received in the first retransmission of the message 710 and the $l_2$ bits of the shaping bits $s_2$ received in the second retransmission of the message 714 as unknown information bits. The receiver 704 may combine the first set of LLRs, the second set of LLRs, and the third set of LLRs to obtain a second combined set of LLRs and may perform a decoding operation based on the second combined set of LLRs and the parity check matrix 900. After the receiver 704 completes the decoding operation based on the, the receiver 704 may extract the k' information bits u.

For example, with reference to the message 706 and the first retransmission of the message 710 in FIG. 7 and the parity check matrix 900 in FIG. 9B, the receiver may combine the first set of LLRs with the second set of LLRs to obtain a first combined set of LLRs and may perform a decoding operation based on the first combined set of LLRs and the parity check matrix 900. Since the message 706 does not include the l shaping bits $s_1$, the $l_2$ shaping bits $s_2$, the $n_2$ parity bits $p_1$, and the $n_3$ parity bits $p_2$, the receiver 704 may set the submatrices 910, 912, 916, 918 to all zero elements as indicated in FIG. 9B. Furthermore, since the first retransmission of the message 710 does not include the $l_2$ shaping bits $s_2$ and the $n_3$ parity bits $p_2$, the receiver 704 may set the submatrices 924 and 930 to all zero elements as indicated in FIG. 9B.

Figure 16:
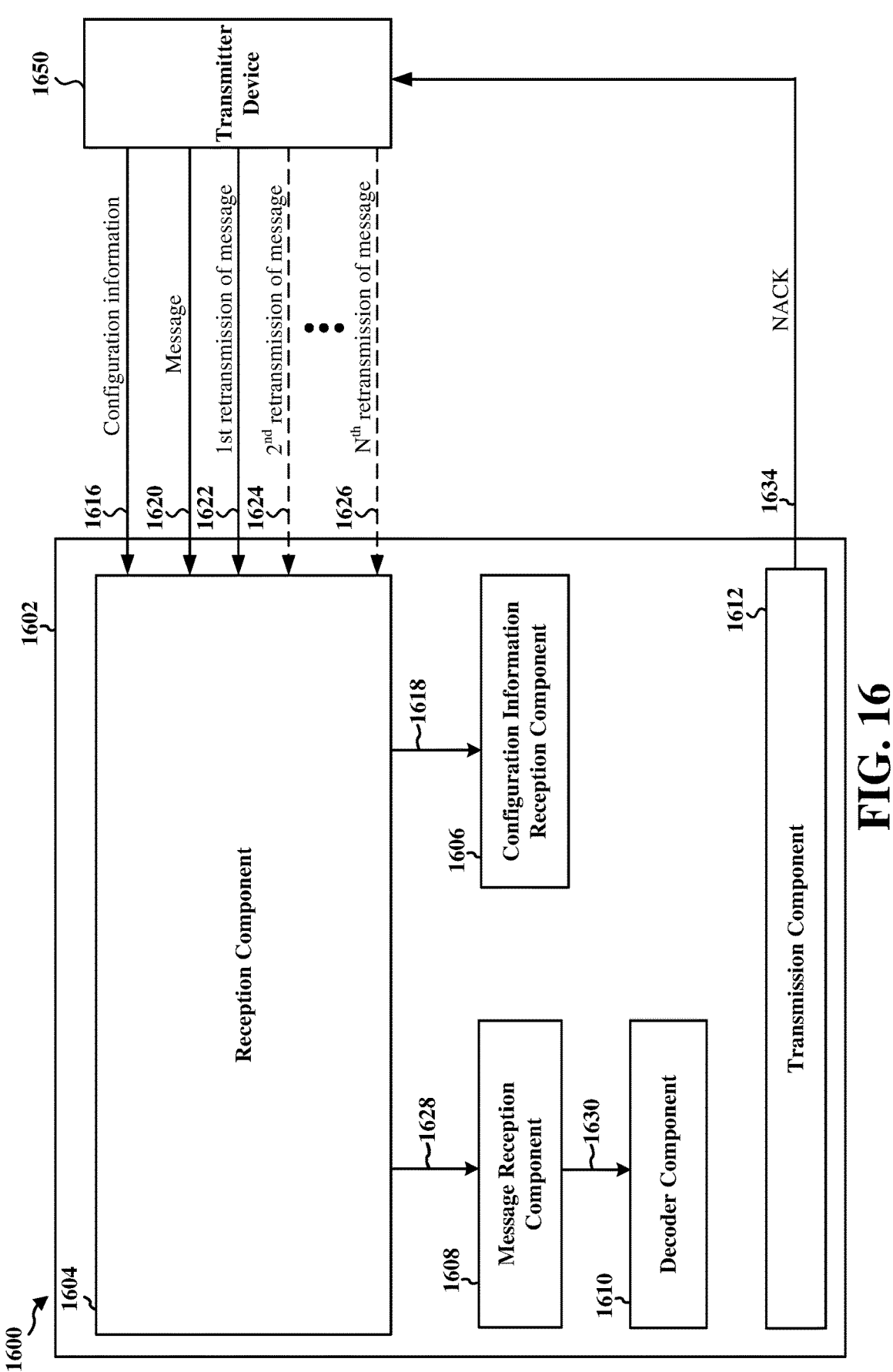
FIG. 16 is a conceptual data flow diagram illustrating the data flow between different means/components in an example apparatus.

FIG. 16 is a conceptual data flow diagram 1600 illustrating the data flow between different means/components in an example apparatus 1602. The apparatus may be a receiver device, such as a UE, a network node (e.g., a base station), or other suitable type of receiver device.

The apparatus includes a reception component 1604 that receives signals from a transmitter device 1650 (e.g., a UE, a network node such as a base station, etc.). The apparatus further includes a configuration information reception component 1606 that receives configuration information 1618 indicating a size of the set of probabilistic shaping bits in each retransmission of the first message and receives configuration information indicating a size of the different set of probabilistic shaping bits. For example, the apparatus receives the configuration information 1618 via a signal 1616 from the transmitter device 1650.

The apparatus includes a message reception component 1608 that receives (e.g., via the reception component and the signal 1628) a first message (e.g., a message 1620 from the transmitter device 1650) including information bits and a first set of error correction bits associated with the information bits. The message reception component 1608 further receives at least a second message (e.g., a first retransmission of the message 1622, a second retransmission of the message 1624, an Nth retransmission of the message 1626 from the transmitter device 1650) associated with the first message, wherein the second message includes a second set of error correction bits associated with the information bits and a set of probabilistic shaping bits for the second set of error correction bits. The message reception component 1608 further receives a message (e.g., a message 1620 from the transmitter device 1650) including information bits and a set of error correction bits associated with the information bits and receives one or more subsequent messages (e.g., a first retransmission of the message 1622, a second retransmission of the message 1624, an Nth retransmission of the message 1626 from the transmitter device 1650) associated with the message, wherein each of the one or more subsequent messages includes a different set of error correction bits associated with the information bits and a different set of probabilistic shaping bits, wherein the different set of probabilistic shaping bits enables reception of the one or more subsequent messages based on modulation constellation symbols with a non-uniform probability distribution.

The apparatus further includes a decoder component 1610 that performs a decoding operation based on the first message (e.g., the message 1620), the second message (e.g., the first retransmission of the message 1622), and a parity check matrix to recover the information bits, wherein the information bits, the first set of error correction bits, the second set of error correction bits, and the set of probabilistic shaping bits are associated with one or more different submatrices of the parity check matrix. The decoder component 1610 further performs a decoding operation based on the message (e.g., the message 1620), the one or more subsequent messages (e.g., a first retransmission of the message 1622, a second retransmission of the message 1624, an Nth retransmission of the message 1626 from the transmitter device 1650), and a parity check matrix to recover the information bits, wherein the information bits, the different set of error correction bits, and the different set of probabilistic shaping bits are associated with one or more different submatrices of the parity check matrix. The decoder component 1610 may receive messages via a signal 1630 from the message reception component 1608.

The apparatus further includes a transmission component 1612 that transmits signals to the transmitter device 1650. In some examples, the signals may include a NACK 1634.

The apparatus may include additional components that perform each of the blocks of the algorithm in the aforementioned flowcharts of FIGS. 14 and 15. As such, each block in the aforementioned flowcharts of FIGS. 14 and 15 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 17:
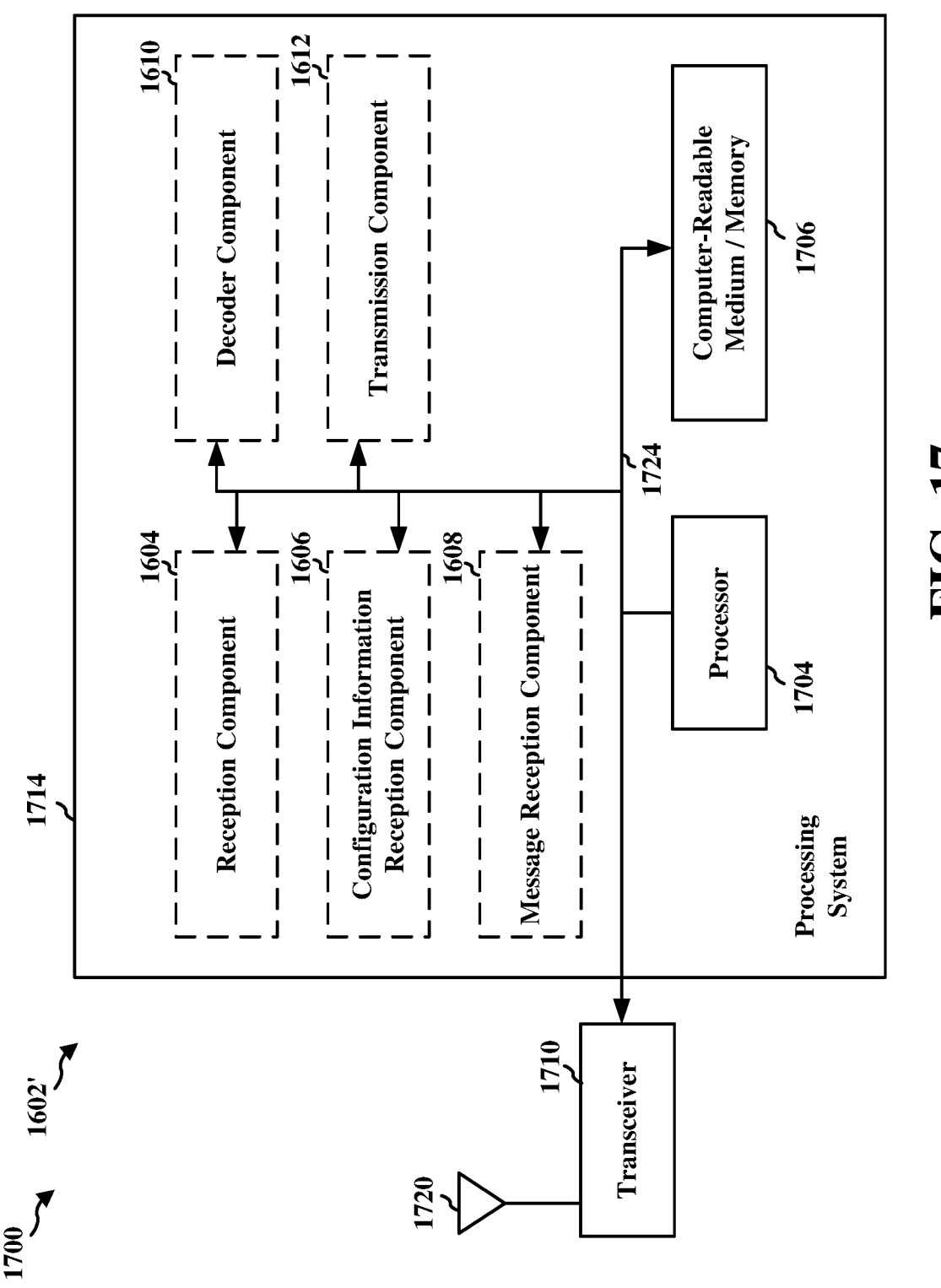
FIG. 17 is a diagram illustrating an example of a hardware implementation for an apparatus employing a processing system.

FIG. 17 is a diagram 1700 illustrating an example of a hardware implementation for an apparatus 1602' employing a processing system 1714. The processing system 1714 may be implemented with a bus architecture, represented generally by the bus 1724. The bus 1724 may include any number of interconnecting buses and bridges depending on the specific application of the processing system 1714 and the overall design constraints. The bus 1724 links together various circuits including one or more processors and/or hardware components, represented by the processor 1704, the components 1604, 1606, 1608, 1610, 1612, and the computer-readable medium/memory 1706. The bus 1724 may also link various other circuits such as timing sources, peripherals, voltage regulators, and power management circuits, which are well known in the art, and therefore, will not be described any further.

The processing system 1714 may be coupled to a transceiver 1710. The transceiver 1710 is coupled to one or more antennas 1720. The transceiver 1710 provides a means for communicating with various other apparatus over a transmission medium. The transceiver 1710 receives a signal from the one or more antennas 1720, extracts information from the received signal, and provides the extracted information to the processing system 1714, specifically the reception component 1604. In addition, the transceiver 1710 receives information from the processing system 1714, specifically the transmission component 1612, and based on the received information, generates a signal to be applied to the one or more antennas 1720. The processing system 1714 includes a processor 1704 coupled to a computer-readable medium/memory 1706. The processor 1704 is responsible for general processing, including the execution of software stored on the computer-readable medium/memory 1706. The software, when executed by the processor 1704, causes the processing system 1714 to perform the various functions described supra for any particular apparatus. The computer-readable medium/memory 1706 may also be used for storing data that is manipulated by the processor 1704 when executing software. The processing system 1714 further includes at least one of the components 1604, 1606, 1608, 1610, 1612. The components may be software components running in the processor 1704, resident/stored in the computer readable medium/memory 1706, one or more hardware components coupled to the processor 1704, or some combination thereof. In some examples, the processing system 1714 may be implemented in a network node (e.g., a base station). In these examples, the processing system 1714 may be a component of the base station 310 and may include the memory 376 and/or at least one of the TX processor 316, the RX processor 370, and the controller/processor 375. Alternatively, the processing system 1714 may be the entire base station (e.g., see 310 of FIG. 3). In some examples, the processing system 1714 may be implemented in a UE. In these examples, the processing system 1714 may be a component of the UE 350 and may include the memory 360 and/or at least one of the TX processor 368, the RX processor 356, and the controller/processor 359. Alternatively, the processing system 1714 may be the entire UE (e.g., see 350 of FIG. 3).

In one configuration, the apparatus 1602/1602' for wireless communication includes means for receiving a first message including information bits and a first set of error correction bits associated with the information bits, means for receiving at least a second message associated with the first message, wherein the second message includes a second set of error correction bits associated with the information bits and a set of probabilistic shaping bits for the second set of error correction bits, means for performing a decoding operation based on the first message, the second message, and a parity check matrix to recover the information bits, wherein the information bits, the first set of error correction bits, the second set of error correction bits, and the set of probabilistic shaping bits are associated with one or more different submatrices of the parity check matrix, means for receiving configuration information indicating a size of the set of probabilistic shaping bits in each retransmission of the first message, means for receiving one or more subsequent messages associated with the message, wherein each of the one or more subsequent messages includes a different set of error correction bits associated with the information bits and a different set of probabilistic shaping bits, wherein the different set of probabilistic shaping bits enables reception of the one or more subsequent messages based on modulation constellation symbols with a non-uniform probability distribution, means for receiving configuration information indicating a size of the different set of probabilistic shaping bits, and means for performing a decoding operation based on the message, the one or more subsequent messages, and a parity check matrix to recover the information bits, wherein the information bits, the different set of error correction bits, and the different set of probabilistic shaping bits are associated with one or more different submatrices of the parity check matrix. The aforementioned means may be one or more of the aforementioned components of the apparatus 1602 and/or the processing system 1714 of the apparatus 1602' configured to perform the functions recited by the aforementioned means.

In some examples, the apparatus 1602/1602' may be implemented as a network node (e.g., a base station). In these examples, and as described supra, the processing system 1314 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

In some examples, the apparatus 1602/1602' may be implemented as a UE. In these examples, and as described supra, the processing system 1314 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Therefore, the aspects described herein may improve the performance of a receiver in a wireless communication system by including shaping parity bits in retransmissions of a channel encoded codeword (e.g., an LDPC codeword). In some examples, these techniques may be applied to HARQ schemes (e.g., IR-HARQ) to provide a shaping gain in HARQ retransmissions. For example, the shaping parity bits may increase the usage of modulation constellation symbols that are closer to a center point of a constellation diagram, which may better enable reception of retransmissions at a receiver.

The following provides an overview of aspects of the present disclosure:

Aspect 1: An apparatus for wireless communication, comprising: a memory; and at least one processor coupled to the memory and configured to: transmit a first message including information bits and a first set of error correction bits associated with the information bits; and transmit at least a second message associated with the first message, wherein the second message includes a second set of error correction bits associated with the information bits and a set of probabilistic shaping bits for the second set of error correction bits.

Aspect 2: The apparatus of aspect 1, wherein the set of probabilistic shaping bits enables transmission of the second message based on modulation constellation symbols with a non-uniform probability distribution.

Aspect 3: The apparatus of aspect 1 or 2, wherein the at least one processor is further configured to: obtain the set of probabilistic shaping bits, wherein the probabilistic shaping bits are based on a first submatrix and a second submatrix of a parity check matrix, wherein the first submatrix is associated with the set of probabilistic shaping bits and the second submatrix is associated with the second set of error correction bits.

Aspect 4: The apparatus of any of aspects 1 through 3, wherein the at least one processor is further configured to: transmit configuration information indicating at least one size of the set of probabilistic shaping bits for each retransmission of the first message, wherein a size of the first submatrix is based on the at least one size of the set of probabilistic shaping bits.

Aspect 5: The apparatus of any of aspects 1 through 4, wherein a first syndrome of the set of probabilistic shaping bits and the second set of error correction bits is equal to a second syndrome of the set of information bits and the first set of error correction bits, wherein the first syndrome of the set of probabilistic shaping bits and the second set of error correction bits is based on the first submatrix and the second submatrix, and wherein the second syndrome of the set of information bits and the first set of error correction bits is based on a third submatrix and a fourth submatrix of the parity check matrix.

Aspect 6: The apparatus of any of aspects 1 through 5, wherein the first submatrix, the second submatrix, the third submatrix, and the fourth submatrix are nonoverlapping.

Aspect 7: The apparatus of any of aspects 1 through 6, wherein the set of probabilistic shaping bits includes at least one nonzero bit.

Aspect 8: The apparatus of any of aspects 1 through 7, wherein the set of probabilistic shaping bits are included in a preconfigured number of reserved bits associated with a shortening operation.

Aspect 9: An apparatus for wireless communication, comprising: a memory; and at least one processor coupled to the memory and configured to: receive a first message including information bits and a first set of error correction bits associated with the information bits; and receive at least a second message associated with the first message, wherein the second message includes a second set of error correction bits associated with the information bits and a set of probabilistic shaping bits for the second set of error correction bits.

Aspect 10: The apparatus of aspect 9, wherein the set of probabilistic shaping bits enables reception of the second message based on modulation constellation symbols with a non-uniform probability distribution.

Aspect 11: The apparatus of aspect 9 or 10, wherein the at least one processor is further configured to: perform a decoding operation based on the first message, the second message, and a parity check matrix to recover the information bits, wherein the information bits, the first set of error correction bits, the second set of error correction bits, and the set of probabilistic shaping bits are associated with one or more different submatrices of the parity check matrix.

Aspect 12: The apparatus of any of aspects 9 through 11, wherein the one or more different submatrices are nonoverlapping.

Aspect 13: The apparatus of any of aspects 9 through 12, wherein the at least one processor configured to perform the decoding operation is further configured to: obtain a first set of log likelihood ratios (LLRs) from the first message and a second set of LLRs from the second message; and combine the first set of LLRs and the second set of LLRs.

Aspect 14: The apparatus of any of aspects 9 through 13, wherein the at least one processor is further configured to: receive configuration information indicating a size of the set of probabilistic shaping bits in each retransmission of the first message.

Aspect 15: The apparatus of any of aspects 9 through 14, wherein the set of probabilistic shaping bits includes at least one nonzero bit.

Aspect 16: An apparatus for wireless communication, comprising: a memory; and at least one processor coupled to the memory and configured to: transmit a message including information bits and a set of error correction bits associated with the information bits; and transmit one or more subsequent messages associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution.

Aspect 17: The apparatus of aspect 16, wherein the at least one processor is further configured to: transmit configuration information indicating a size of the different set of probabilistic shaping bits.

Aspect 18: The apparatus of aspect 16 or 17, wherein the set of probabilistic shaping bits includes at least one nonzero bit.

Aspect 19: The apparatus of any of aspects 16 through 18, wherein the set of probabilistic shaping bits are included in a preconfigured number of reserved bits associated with a shortening operation.

Aspect 20: An apparatus for wireless communication, comprising: a memory; and at least one processor coupled to the memory and configured to: receive a message including information bits and a set of error correction bits associated with the information bits; and receive one or more subsequent messages associated with the message, wherein each of the one or more subsequent messages includes a different set of error correction bits associated with the information bits and a different set of probabilistic shaping bits, wherein the different set of probabilistic shaping bits enables reception of the one or more subsequent messages based on modulation constellation symbols with a non-uniform probability distribution.

Aspect 21: The apparatus of aspect 20, wherein the at least one processor is further configured to: receive configuration information indicating a size of the different set of probabilistic shaping bits.

Aspect 22: The apparatus of aspect 20 or 21, wherein the set of probabilistic shaping bits includes at least one nonzero bit.

Aspect 23: The apparatus of any of aspects 20 through 22, wherein the at least one processor is further configured to: perform a decoding operation based on the message, the one or more subsequent messages, and a parity check matrix to recover the information bits, wherein the information bits, the different set of error correction bits, and the different set of probabilistic shaping bits are associated with one or more different submatrices of the parity check matrix.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus for wireless communication, comprising:
a memory; and
at least one processor coupled to the memory and configured to:
transmit a first message including information bits and a first set of error correction bits associated with the information bits; and
transmit at least a second message associated with the first message, wherein the second message includes a second set of error correction bits associated with the information bits and a set of probabilistic shaping bits for the second set of error correction bits;
wherein a first syndrome of the set of probabilistic shaping bits and the second set of error correction bits is equal to a second syndrome of the information bits and the first set of error correction bits.

2. The apparatus of claim 1, wherein the set of probabilistic shaping bits enables transmission of the second message based on modulation constellation symbols with a non-uniform probability distribution.

3. The apparatus of claim 1, wherein the at least one processor is further configured to:
obtain the set of probabilistic shaping bits, wherein the probabilistic shaping bits are based on a first submatrix and a second submatrix of a parity check matrix, wherein the first submatrix is associated with the set of probabilistic shaping bits and the second submatrix is associated with the second set of error correction bits.

4. The apparatus of claim 3, wherein the at least one processor is further configured to:
transmit configuration information indicating at least one size of the set of probabilistic shaping bits for each retransmission of the first message, wherein a size of the first submatrix is based on the at least one size of the set of probabilistic shaping bits.

5. The apparatus of claim 3,
wherein the first syndrome of the set of probabilistic shaping bits and the second set of error correction bits is based on the first submatrix and the second submatrix, and wherein the second syndrome of the information bits and the first set of error correction bits is based on a third submatrix and a fourth submatrix of the parity check matrix.

6. The apparatus of claim 5, wherein the first submatrix, the second submatrix, the third submatrix, and the fourth submatrix are nonoverlapping.

7. The apparatus of claim 1, wherein the set of probabilistic shaping bits includes at least one nonzero bit.

8. The apparatus of claim 1, wherein the set of probabilistic shaping bits are included in a preconfigured number of reserved bits associated with a shortening operation.

9. An apparatus for wireless communication, comprising:
a memory; and
at least one processor coupled to the memory and configured to:
receive a first message including information bits and a first set of error correction bits associated with the information bits;
receive at least a second message associated with the first message, wherein the second message includes a second set of error correction bits associated with the information bits and a set of probabilistic shaping bits for the second set of error correction bits; and
perform a decoding operation based on the first message, the second message, and a parity check matrix to recover the information bits, wherein the information bits, the first set of error correction bits, the second set of error correction bits, and the set of probabilistic shaping bits are associated with one or more different submatrices of the parity check matrix.

10. The apparatus of claim 9, wherein the set of probabilistic shaping bits enables reception of the second message based on modulation constellation symbols with a non-uniform probability distribution.

11. The apparatus of claim 9, wherein the one or more different submatrices are nonoverlapping.

12. The apparatus of claim 9, wherein the at least one processor configured to perform the decoding operation is further configured to:

obtain a first set of log likelihood ratios (LLRs) from the first message and a second set of LLRs from the second message; and combine the first set of LLRs and the second set of LLRs.

13. The apparatus of claim 9, wherein the at least one processor is further configured to:

receive configuration information indicating a size of the set of probabilistic shaping bits in each retransmission of the first message.

14. The apparatus of claim 9, wherein the set of probabilistic shaping bits includes at least one nonzero bit.

15. An apparatus for wireless communication, comprising:

a memory; and at least one processor coupled to the memory and configured to:

transmit a message including information bits and a set of error correction bits associated with the information bits; and transmit one or more subsequent messages associated with the message, wherein each of the one or more subsequent messages includes a different set of error correction bits associated with the information bits and a different set of probabilistic shaping bits, wherein the different set of probabilistic shaping bits enables transmission of the one or more subsequent messages based on modulation constellation symbols with a non-uniform probability distribution;

wherein the information bits, the different set of error correction bits, and the different set of probabilistic shaping bits are associated with one or more different submatrices of a parity check matrix, and wherein the message, the one or more subsequent messages, and the parity check matrix enable a decoding operation to recover the information bits.

16. The apparatus of claim 15, wherein the at least one processor is further configured to:

transmit configuration information indicating a size of the different set of probabilistic shaping bits.

17. The apparatus of claim 15, wherein the set of probabilistic shaping bits includes at least one nonzero bit.

18. The apparatus of claim 15, wherein the set of probabilistic shaping bits are included in a preconfigured number of reserved bits associated with a shortening operation.

19. An apparatus for wireless communication, comprising:

a memory; and at least one processor coupled to the memory and configured to:

receive a message including information bits and a set of error correction bits associated with the information bits;

receive one or more subsequent messages associated with the message, wherein each of the one or more subsequent messages includes a different set of error correction bits associated with the information bits and a different set of probabilistic shaping bits, wherein the different set of probabilistic shaping bits enables reception of the one or more subsequent messages based on modulation constellation symbols with a non-uniform probability distribution; and perform a decoding operation based on the message, the one or more subsequent messages, and a parity check matrix to recover the information bits, wherein the information bits, the different set of error correction bits, and the different set of probabilistic shaping bits are associated with one or more different submatrices of the parity check matrix.

20. The apparatus of claim 19, wherein the at least one processor is further configured to:

receive configuration information indicating a size of the different set of probabilistic shaping bits.

21. The apparatus of claim 19, wherein the set of probabilistic shaping bits includes at least one nonzero bit.

\* \* \* \* \*